(12) United States Patent
Kasuya et al.

(10) Patent No.: US 12,394,585 B2
(45) Date of Patent: Aug. 19, 2025

(54) ELECTRON SOURCE, ELECTRON GUN, AND CHARGED PARTICLE BEAM DEVICE

(71) Applicant: Hitachi High-Tech Corporation, Tokyo (JP)

(72) Inventors: Keigo Kasuya, Tokyo (JP); Shuhei Ishikawa, Tokyo (JP); Kenji Tanimoto, Tokyo (JP); Takashi Doi, Tokyo (JP); Soichiro Matsunaga, Tokyo (JP); Hiroshi Morita, Tokyo (JP); Daigo Komesu, Tokyo (JP); Kenji Miyata, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 455 days.

(21) Appl. No.: 17/928,401

(22) PCT Filed: Jun. 29, 2020

(86) PCT No.: PCT/JP2020/025496
§ 371 (c)(1),
(2) Date: Nov. 29, 2022

(87) PCT Pub. No.: WO2022/003770
PCT Pub. Date: Jan. 6, 2022

(65) Prior Publication Data
US 2023/0352262 A1 Nov. 2, 2023

(51) Int. Cl.
*H01J 37/065* (2006.01)
*H01J 37/073* (2006.01)
*H01J 37/28* (2006.01)

(52) U.S. Cl.
CPC .......... *H01J 37/065* (2013.01); *H01J 37/073* (2013.01); *H01J 37/28* (2013.01)

(58) Field of Classification Search
USPC ........................................................ 250/427
See application file for complete search history.

(56) References Cited

U.S. PATENT DOCUMENTS

| | | | |
|---|---|---|---|
| 2010/0127170 A1 | 5/2010 | Fujita et al. | |
| 2012/0049064 A1 | 3/2012 | Ren | |
| 2022/0199349 A1* | 6/2022 | Kasuya | ................... H01J 37/06 |

FOREIGN PATENT DOCUMENTS

| | | | |
|---|---|---|---|
| JP | H08-171879 A | 7/1996 | |
| JP | 2001-283758 A | 10/2001 | |

(Continued)

OTHER PUBLICATIONS

International Search Report, PCT/JP2020/025496, dated Sep. 15, 2020. 2 pages.

(Continued)

*Primary Examiner* — Kiet T Nguyen
(74) *Attorney, Agent, or Firm* — Volpe Koenig

(57) ABSTRACT

In an electron source including a suppressor electrode having an opening at one end portion thereof in a direction along a central axis and an electron emission material having a distal end protruding from the opening, the suppressor electrode further includes a receding portion receding to a position farther from the distal end of the electron emission material than the opening in the direction along the central axis at a position in an outer peripheral direction than the opening, and at least a part of the receding portion is disposed within a diameter of 2810 μm from a center of the opening. Accordingly, an electron source, an electron gun, and a charged particle beam device such as an electron microscope using the same, in which a machine difference in a device performance due to an axial shift between the electron emission material and the suppressor electrode is reduced, are implemented.

17 Claims, 14 Drawing Sheets

(56) References Cited

FOREIGN PATENT DOCUMENTS

| JP | 2003-513407 A | 4/2003 |
|----|---------------|--------|
| JP | 2007-250491 A | 9/2007 |
| JP | 2009-541966 A | 11/2009 |
| JP | 2017-204342 A | 11/2017 |
| TW | 201209877 A | 3/2012 |
| WO | 2000/024030 A | 4/2000 |

OTHER PUBLICATIONS

Taiwan Office Action, Application No. 110123492, dated Jun. 15, 2022. 8 pages.

\* cited by examiner

[FIG. 1]
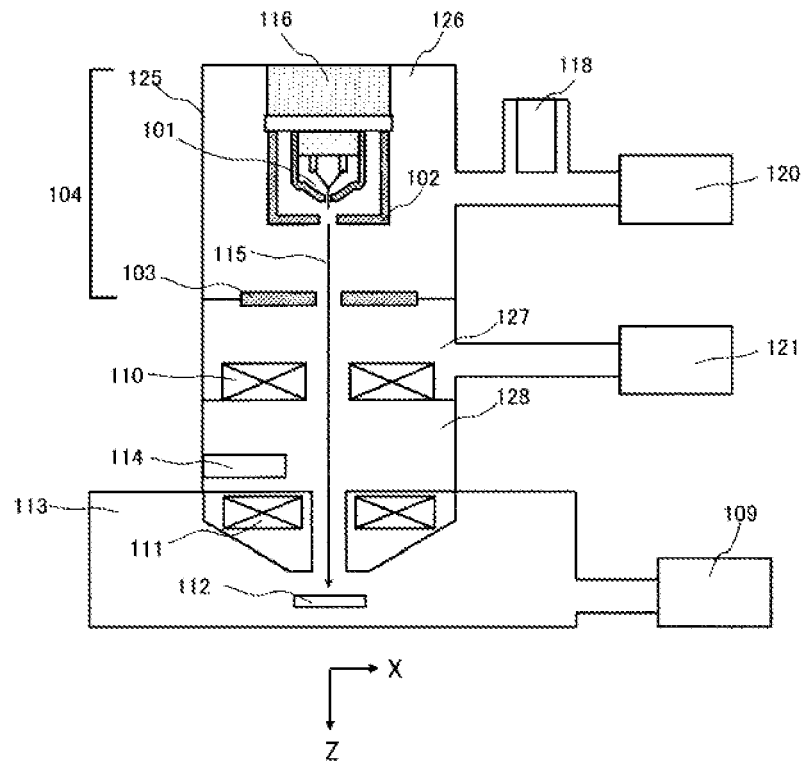
[FIG. 2]
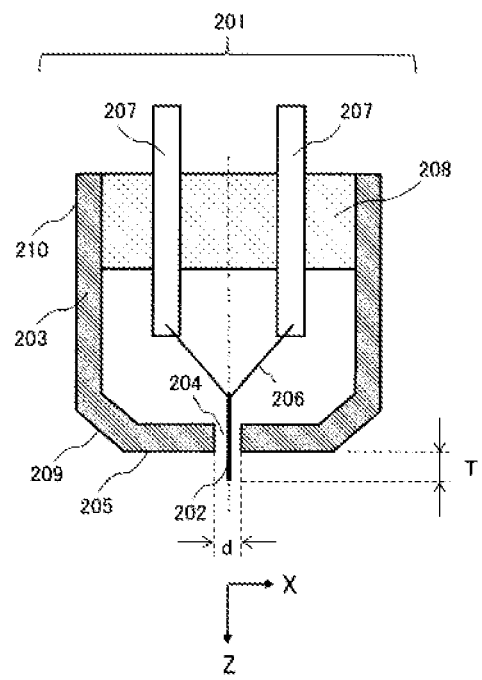

[FIG. 3A]
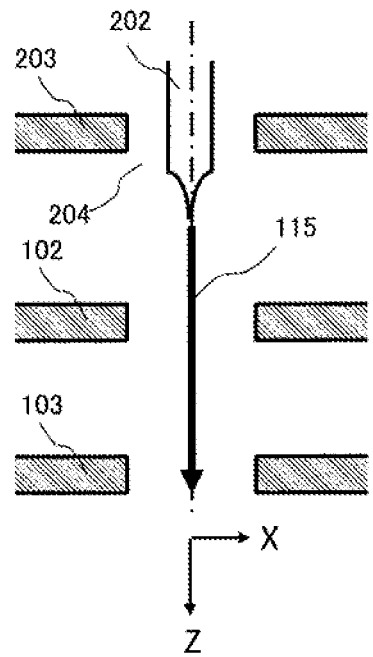
[FIG. 3B]
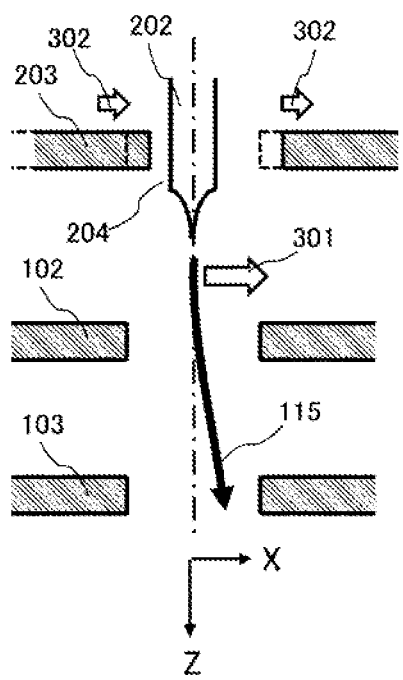

[FIG. 4]
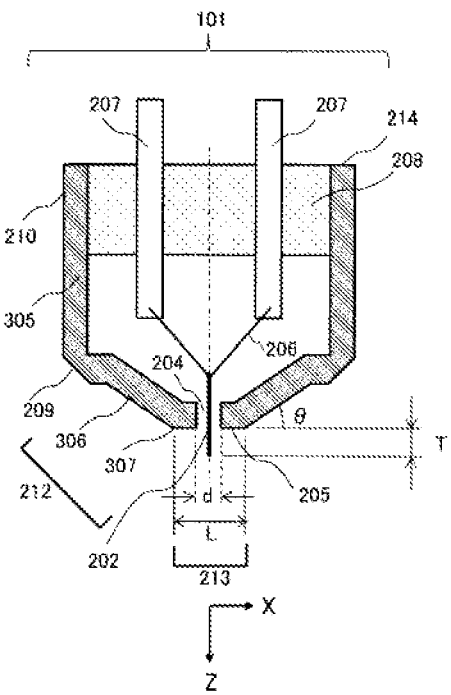
[FIG. 5A]
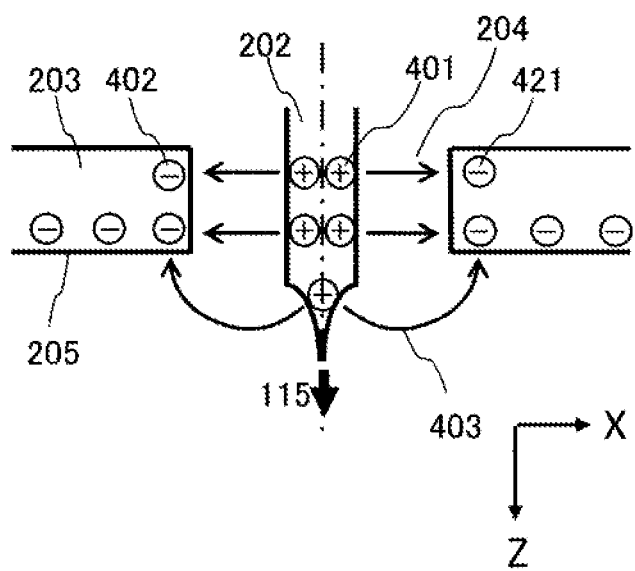

[FIG. 5B]
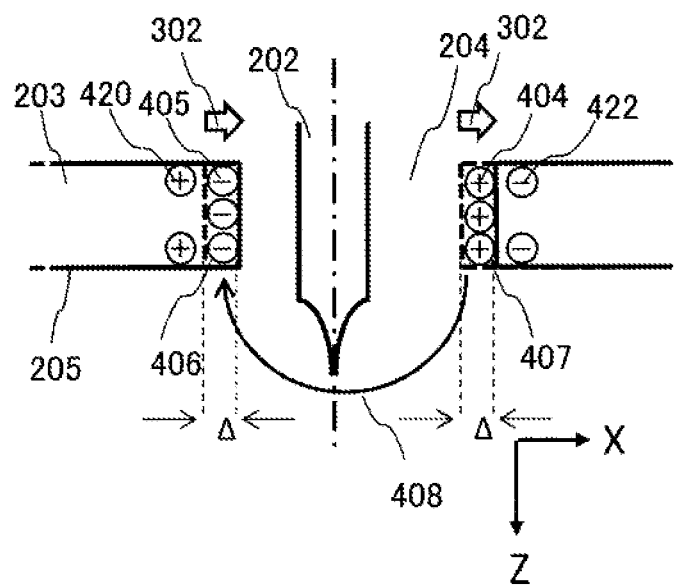
[FIG. 5C]
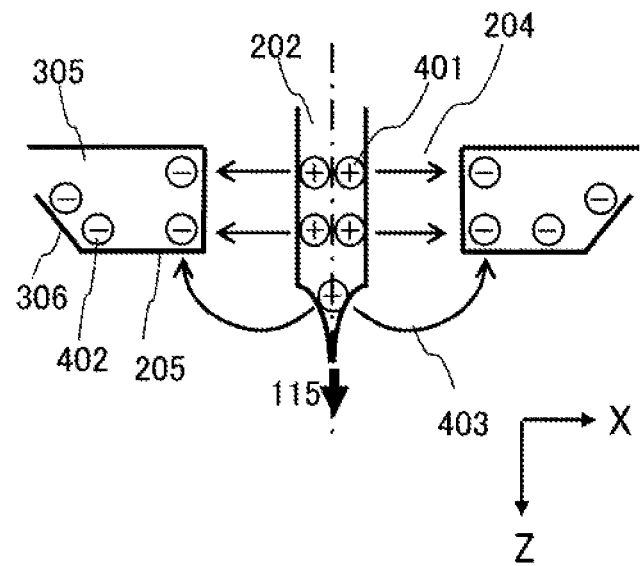

[FIG. 5D]
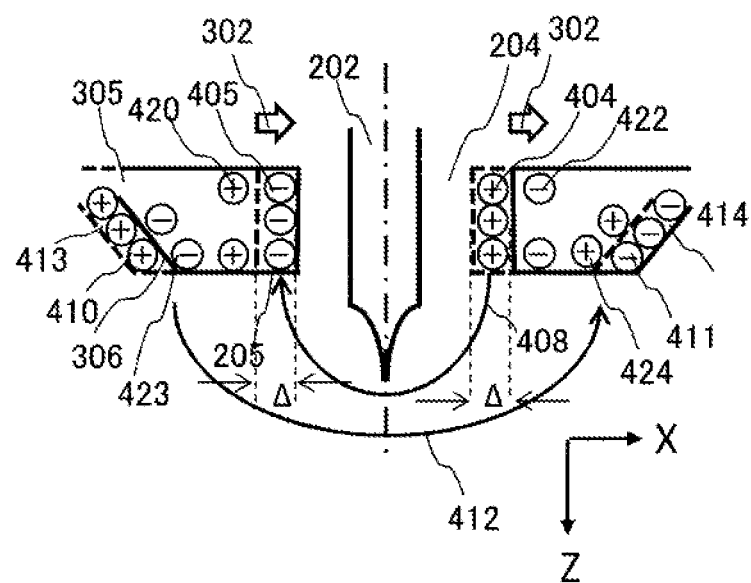
[FIG. 6A]
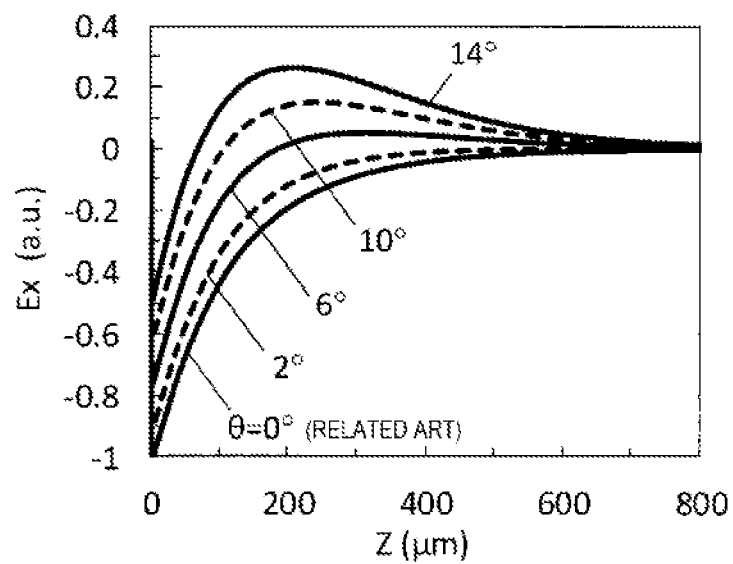

[FIG. 6B]
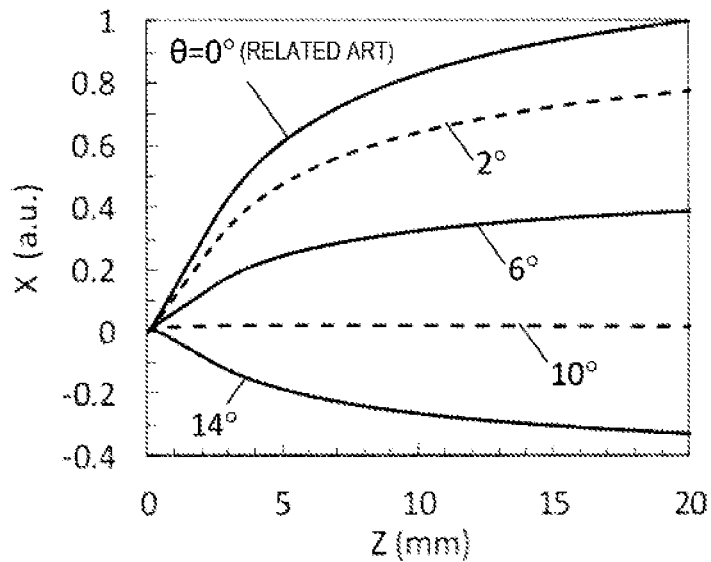
[FIG. 7A]
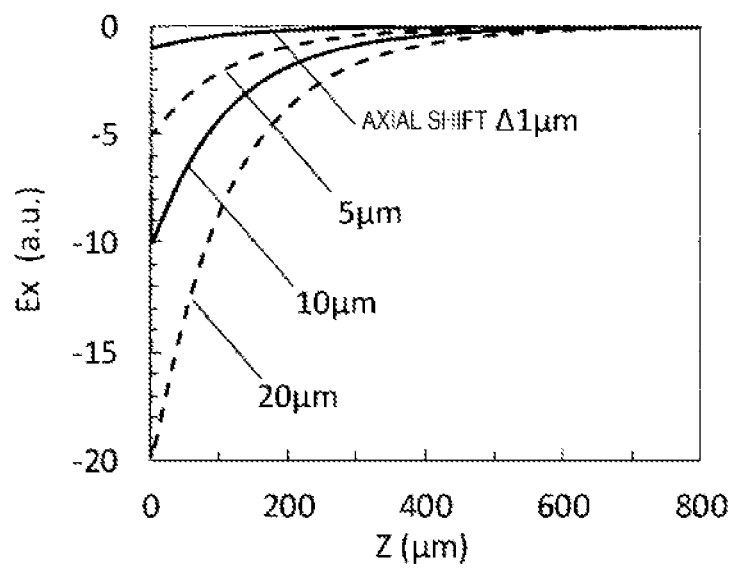

[FIG. 7B]
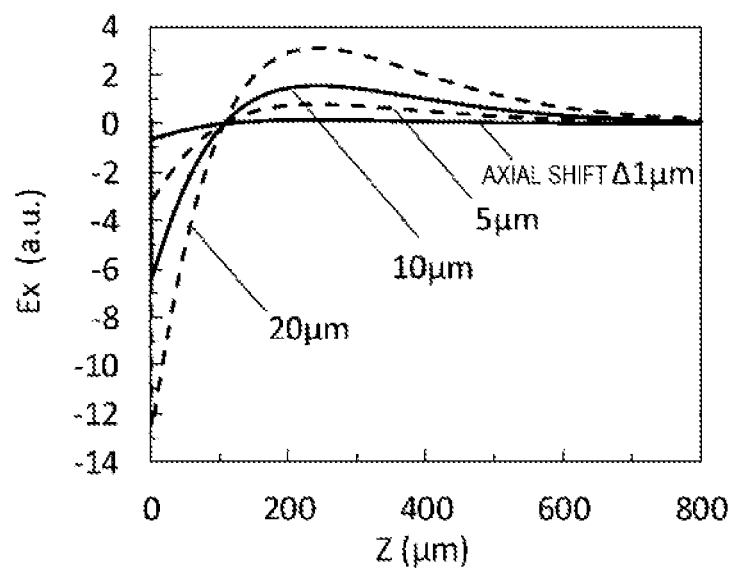
[FIG. 7C]
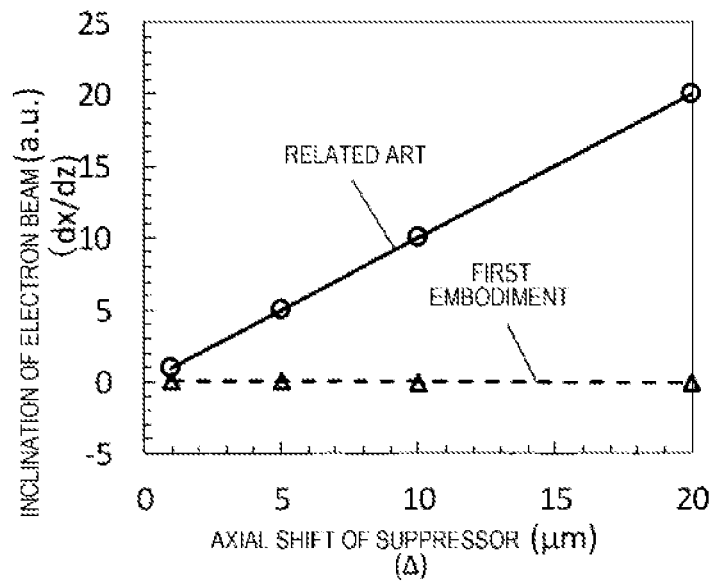

[FIG. 8A]
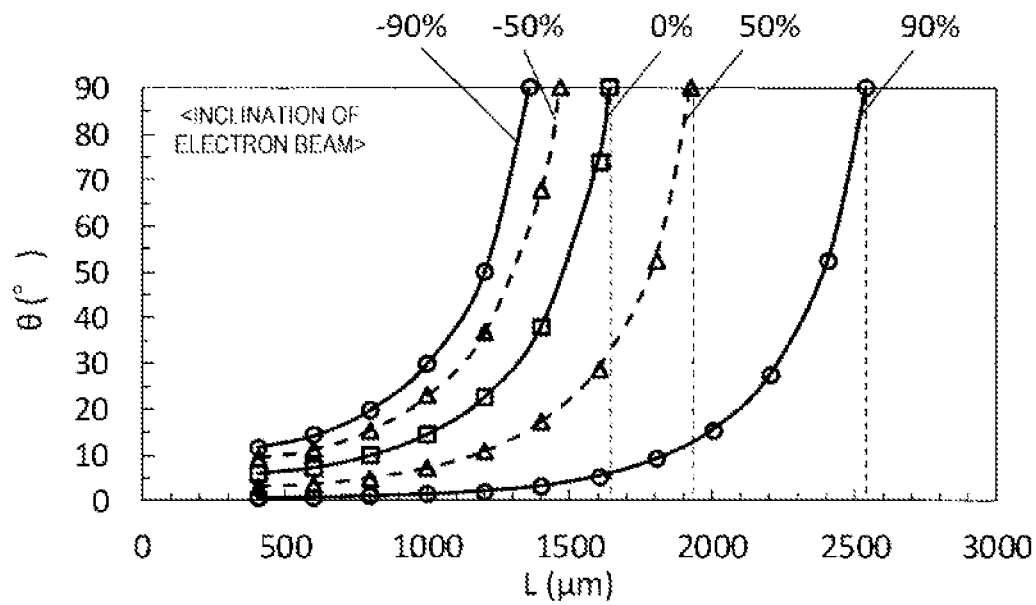
[FIG. 8B]
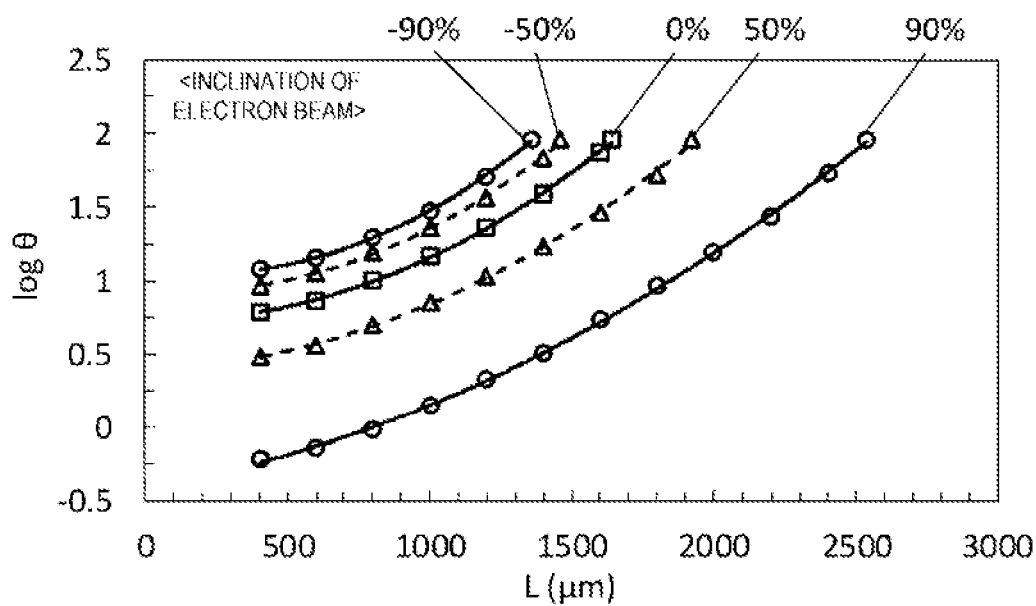

[FIG. 9]
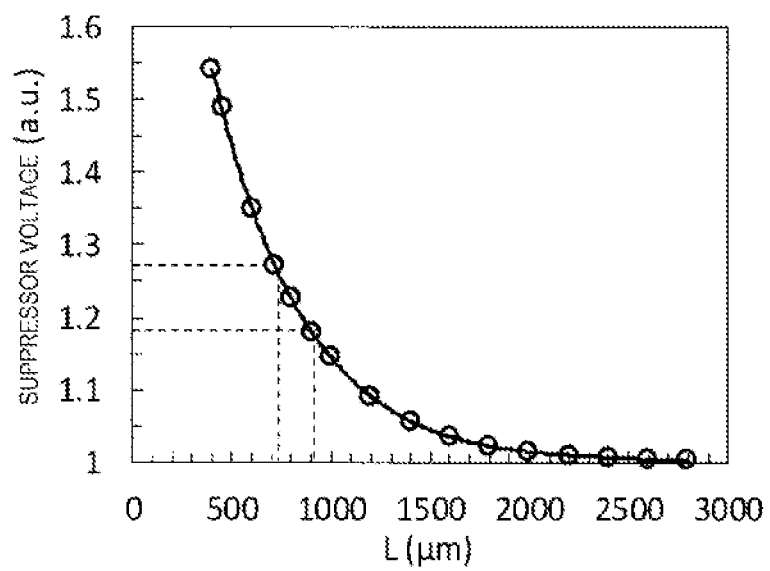
[FIG. 10]
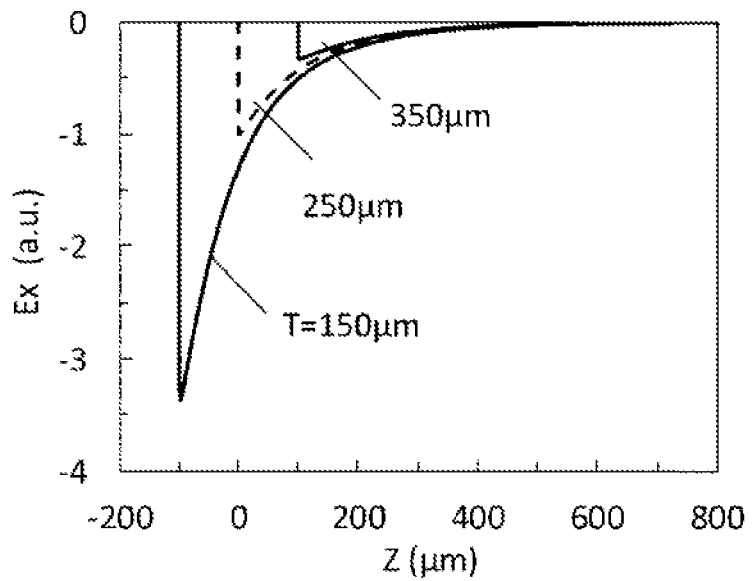

[FIG. 11A]
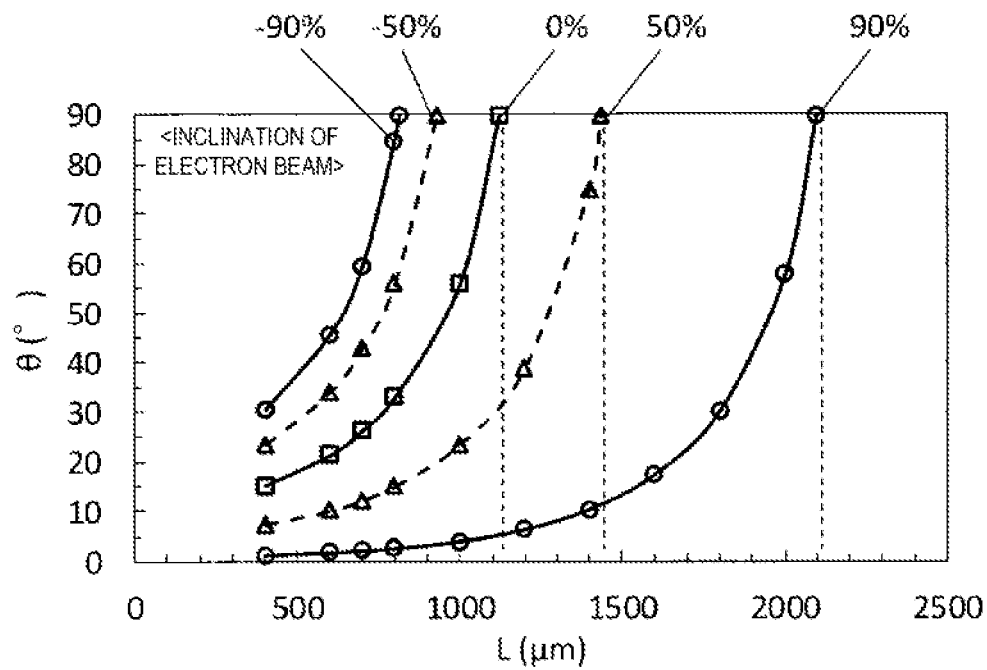
[FIG. 11B]
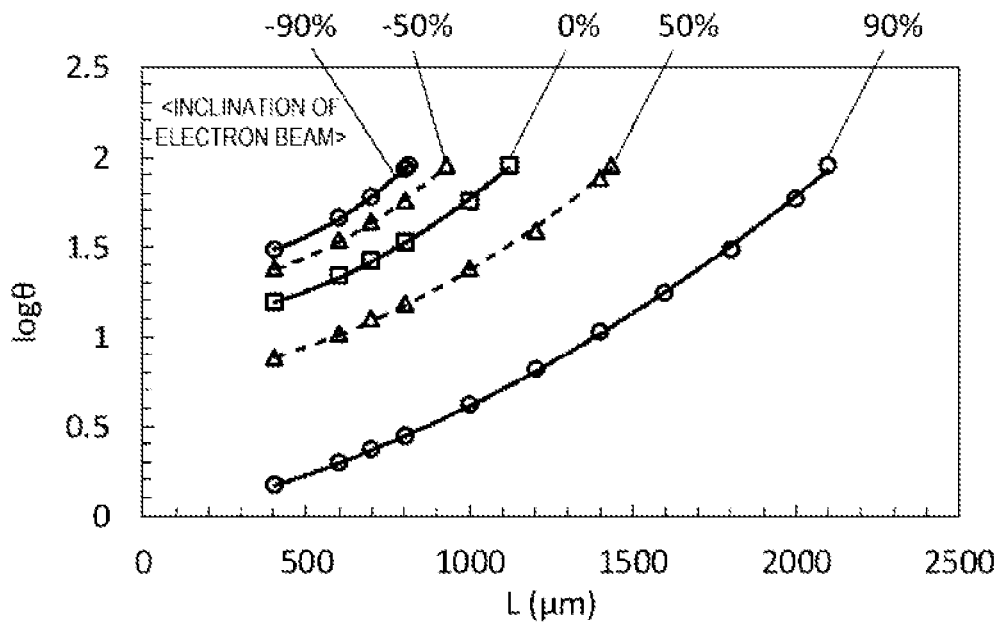

[FIG. 12A]
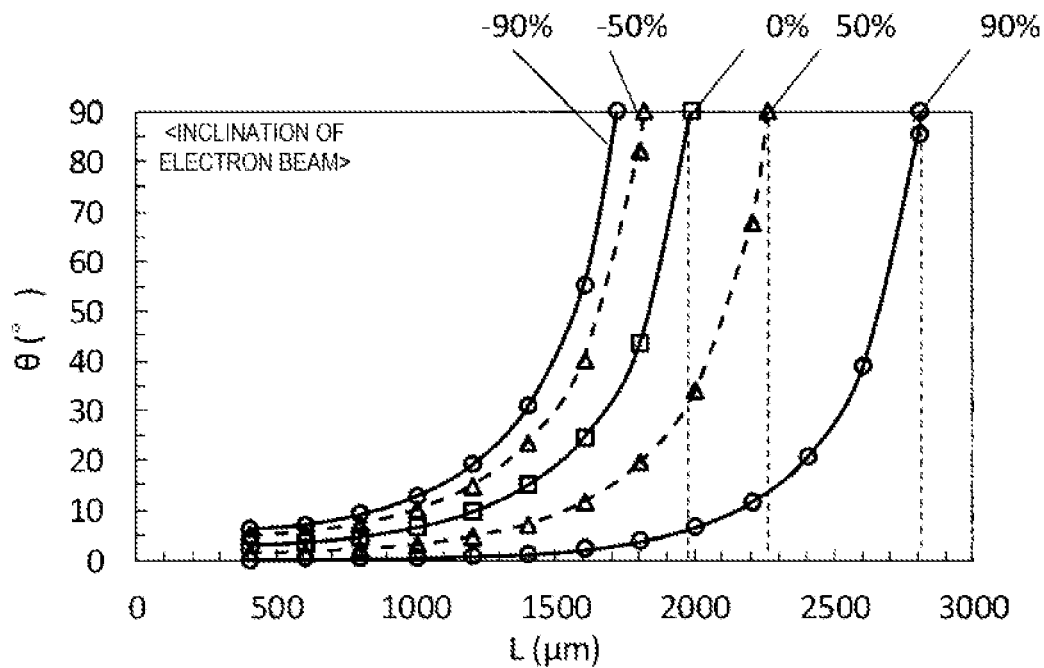
[FIG. 12B]
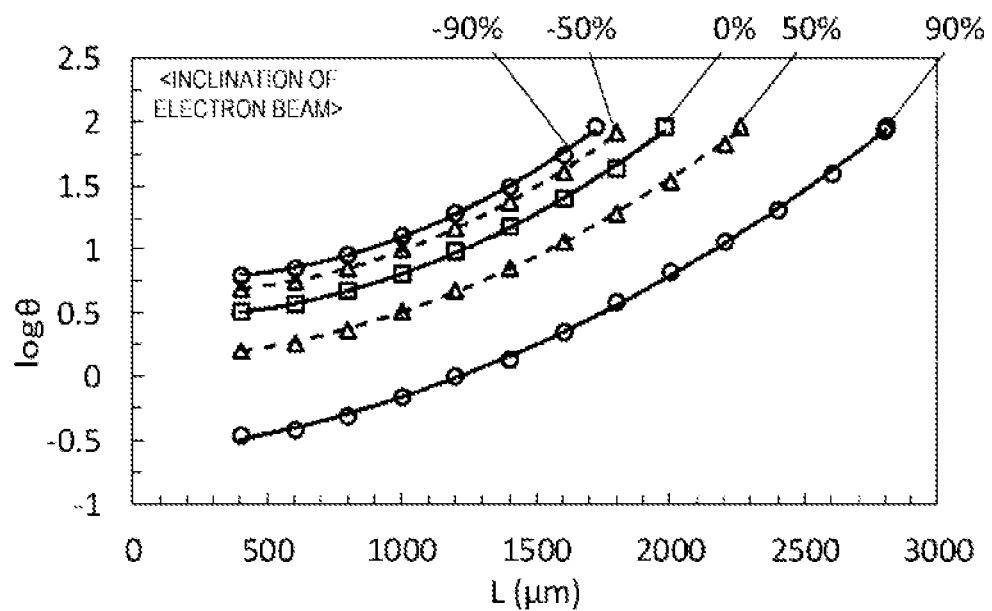

[FIG. 13]
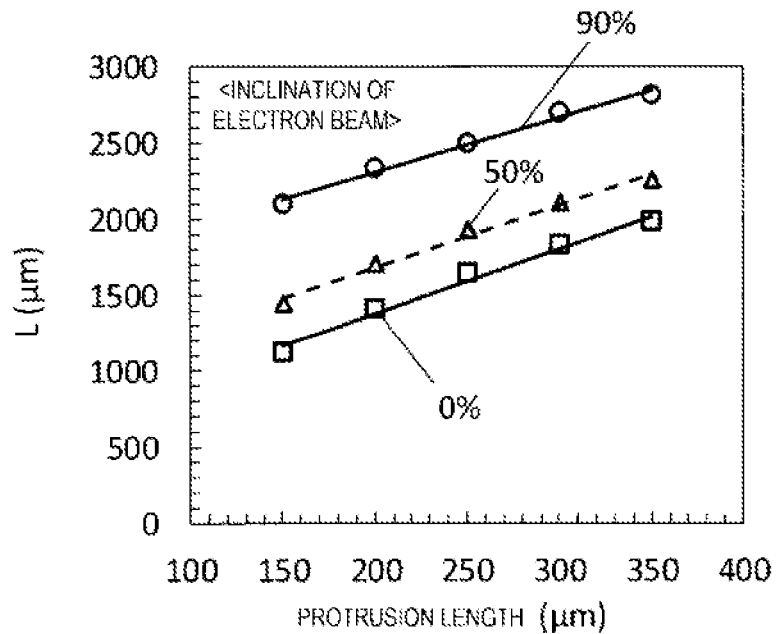
[FIG. 14]
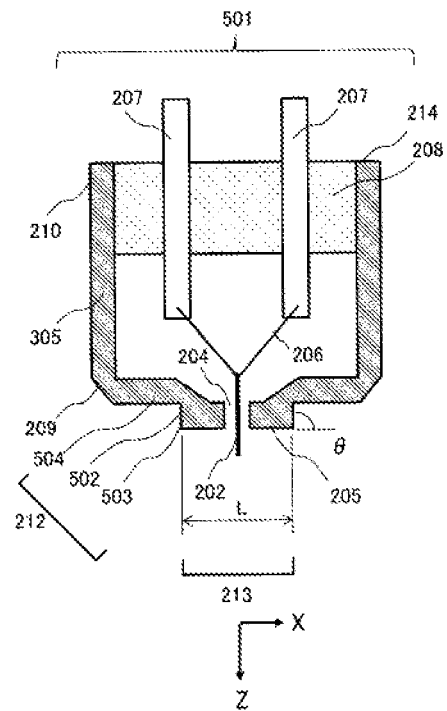

[FIG. 15]
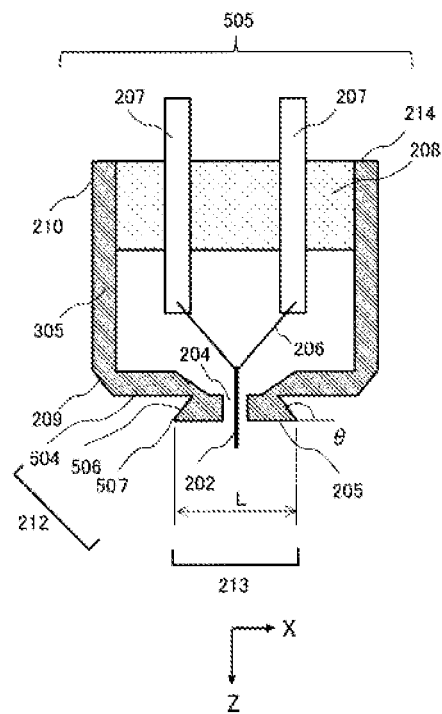
[FIG. 16]
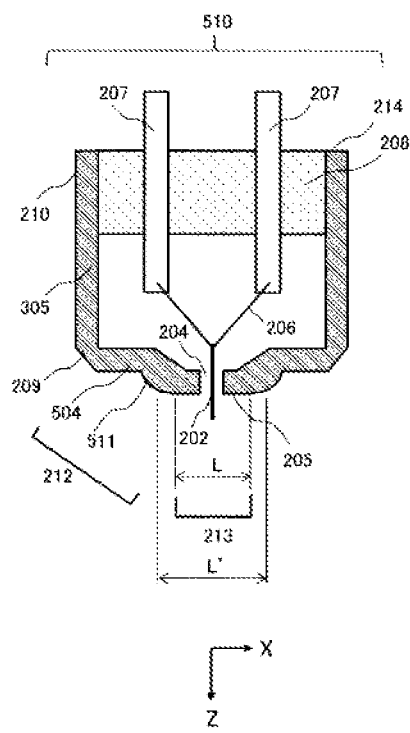

[FIG. 17]
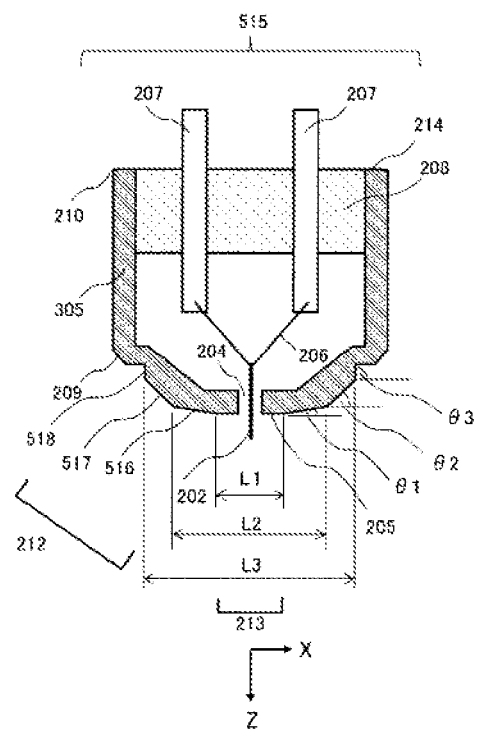
[FIG. 18]
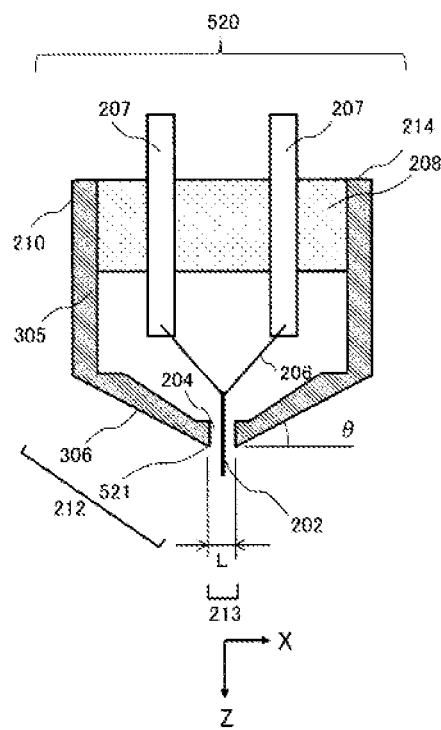

ELECTRON SOURCE, ELECTRON GUN, AND CHARGED PARTICLE BEAM DEVICE

TECHNICAL FIELD

The present invention relates to an electron source that supplies an electron beam to be emitted to a sample, an electron gun, and a charged particle beam device using the electron gun.

BACKGROUND ART

A charged particle beam device is a device that irradiates a sample with an electron beam emitted from an electron source and an electron gun, X-rays emitted by irradiating a target of an X-ray source with the electron beam, or an ion beam emitted from an ion source, and processes the sample or generates an observation image by using secondary electrons, transmission electrons, back scattered electrons, the X-rays, or the like emitted from the sample. Examples of the charged particle beam device include an electron microscope, an electron beam lithography device, an X-ray microscope, CT, and an ion microscope.

In these charged particle beam devices, an image to be generated and an irradiation state thereof are required to have high spatial resolution and excellent reproducibility when observation and irradiation are performed repeatedly.

For example, in the electron microscope, in order to implement high spatial resolution, it is necessary that brightness of the electron beam to be emitted to the sample is high. As an electron source that emits an electron beam having high brightness, a Schottky emitter (hereinafter, referred to as an SE electron source) and a cold field emitter (hereinafter, referred to as a CFE electron source) are widely used. PTL 1 discloses an example of a structure of the SE electron source.

Further, in recent years, miniaturization and complication of semiconductor devices have progressed, and electron microscopes have been widely used for process management of manufacturing processes thereof. In addition to a high resolution performance described above, the electron microscope responsible for semiconductor measurement is required to obtain measurement results of the same dimensions in any device when the same sample is observed, that is, to have a small machine difference in the measurement results among the devices.

CITATION LIST

Patent Literature

PTL 1: JP-A-H8-171879

SUMMARY OF INVENTION

Technical Problem

As described in PTL 1, the SE electron source includes a suppressor electrode having an opening, and a single crystal wire (hereinafter, referred to as a tip) as an electron emission material that emits electrons from a distal end portion, and has a structure in which the distal end portion (electron emission portion) of the tip protrudes from the opening of the suppressor electrode. Further, an extraction electrode or the like is added to the SE electron source to form an electron gun (SE electron gun). In the SE electron gun, the electrons are emitted from a tip distal end by heating the tip and applying an electric field by the extraction electrode. The suppressor electrode has a function of suppressing unnecessary thermal electrons emitted from portions other than the distal end portion of the tip by applying a negative potential to the tip distal end.

In order to achieve this function, it is required that central axes of the tip and the opening of the suppressor electrode are aligned with high accuracy. Therefore, the tip and the opening of the suppressor electrode are aligned and assembled to be mechanically coaxial with each other, and are integrated as an electron source. The electron source is mounted on a device such as an electron microscope, and an electron beam is emitted and used.

Here, as a result of research by inventors, it has been found that, for each individual electron source, the central axis of the tip and the central axis of the opening of the suppressor electrode may be shifted from each other by several μm to several tens of μm, for example, in a case in which an aperture diameter of the suppressor electrode is about 400 μm. When the central axes of the tip and the suppressor electrode are shifted from each other, the electric field generated by the suppressor electrode has an axially shifted distribution with respect to the tip, and an electric field in a direction (lateral direction) perpendicular to the center axis is generated in a space in front of the tip. The electron beam emitted from the tip distal end is bent in the lateral direction by the electric field, and passes outside an axis of a lens located downstream. As a result, off-axis aberration occurs in the lens, and a focused diameter of the electron beam emitted to the sample is increased, resulting in deteriorated resolution.

As an axial shift amount between the tip and the suppressor electrode increases, the electric field in the lateral direction increases. Therefore, the electron beam is greatly bent, and the off-axis aberration is also increased. Since the axial shift amount between the tip and the suppressor electrode is different for each individual electron source, a magnitude of the off-axis aberration is also changed for each device on which the electron source is mounted, and a difference occurs in the resolution. As a result, there is a problem in that a machine difference between devices such as an electron microscope increases.

In addition, when the axial shift amount between the tip and the suppressor electrode is particularly large, since the electron beam is largely bent, the electron beam cannot pass through an opening of a diaphragm or an electrode disposed downstream. In this case, the electron beam cannot reach the sample, resulting in a manufacturing failure of the electron source, the electron gun, or the electron microscope. This causes problems such as an increase in manufacturing cost and an increase in lead time.

An object of the invention is to provide an electron source, an electron gun, and a charged particle beam device such as an electron microscope using the same, in which a machine difference is reduced.

Solution to Problem

An electron source according to an embodiment of the invention includes: a suppressor electrode having an opening at one end portion thereof in a direction along a central axis; and an electron emission material having a distal end protruding from the opening. The suppressor electrode further includes a receding portion receding to a position farther from the distal end of the electron emission material than the end portion of the suppressor electrode in the direction along the central axis at a position in an outer peripheral direction than the opening, and at least a part of the receding portion is disposed within a diameter of 2810 μm from a center of the opening.

Advantageous Effects of Invention

According to the invention, an electron source, an electron gun, and a charged particle beam device such as an electron microscope using the same, in which a machine difference is reduced, can be provided. Other problems and novel features will become apparent based on the description of this specification and the accompanying drawings.

BRIEF DESCRIPTION OF DRAWINGS

FIG. 1 is a schematic diagram of a scanning electron microscope according to a first embodiment.

FIG. 2 is a diagram showing a configuration of an SE electron source in the related art.

FIG. 3A is a diagram showing a principle of bending of an electron beam in the SE electron source in the related art.

FIG. 3B is a diagram showing the principle of the bending of the electron beam in the SE electron source in the related art.

FIG. 4 is a diagram showing a configuration of an SE electron source according to the first embodiment.

FIG. 5A is a diagram showing a principle of a trajectory of the electron beam in the SE electron source in the related art.

FIG. 5B is a diagram showing the principle of the trajectory of the electron beam in the SE electron source in the related art.

FIG. 5C is a diagram showing a principle of a trajectory of an electron beam in the SE electron source according to the first embodiment.

FIG. 5D is a diagram showing the principle of the trajectory of the electron beam in the SE electron source according to the first embodiment.

FIG. 6A is a diagram showing an influence of an angle θ of a tapered surface on the electron beam in the SE electron source according to the first embodiment.

FIG. 6B is a diagram showing an influence of the angle θ of the tapered surface on the electron beam in the SE electron source according to the first embodiment.

FIG. 7A is a diagram showing an influence of an axial shift amount between a tip and a suppressor electrode on the electron beam in the SE electron source in the related art.

FIG. 7B is a diagram showing an influence of an axial shift amount between a tip and a suppressor electrode on the electron beam in the SE electron source according to the first embodiment.

FIG. 7C is a diagram showing an influence of the axial shift amount between the tip and the suppressor electrode on the electron beam in the SE electron sources according to the related-art type and the first embodiment.

FIG. 8A is a diagram showing a relationship between influences of an L and a θ on the electron beam in the SE electron source according to the first embodiment.

FIG. 8B is a diagram showing a relationship between influences of the L and the θ on the electron beam in the SE electron source according to the first embodiment.

FIG. 9 is a diagram showing an example of a suppressor voltage required in the SE electron source according to the first embodiment.

FIG. 10 is a diagram showing an influence on the electron beam when a protrusion length T of the tip is changed in the SE electron source in the related art.

FIG. 11A is a diagram showing a relationship between influences of the L and the θ on an electron beam in an SE electron source according to a second embodiment.

FIG. 11B is a diagram showing a relationship between influences of the L and the θ on the electron beam in the SE electron source according to the second embodiment.

FIG. 12A is a diagram showing a relationship between influences of the L and the θ on the electron beam in the SE electron source according to the second embodiment.

FIG. 12B is a diagram showing a relationship between influences of the L and the θ on the electron beam in the SE electron source according to the second embodiment.

FIG. 13 is a diagram showing a relationship between influences of a T and the L on the electron beam in the SE electron source according to the second embodiment.

FIG. 14 is a diagram showing a configuration of an SE electron source according to a third embodiment.

FIG. 15 is a diagram showing a configuration of an SE electron source according to a fourth embodiment.

FIG. 16 is a diagram showing a configuration of an SE electron source according to a fifth embodiment.

FIG. 17 is a diagram showing a configuration of an SE electron source according to a sixth embodiment.

FIG. 18 is a diagram showing a configuration of an SE electron source according to a seventh embodiment.

DESCRIPTION OF EMBODIMENTS

Hereinafter, various embodiments of an electron source, an electron gun, and a charged particle beam device such as an electron microscope according to the invention will be sequentially described with reference to the drawings. Examples of the charged particle beam device include an electron microscope that generates an observation image of a sample by irradiating the sample with an electron beam and detecting secondary electrons, back scattered electrons, transmission electrons, or the like emitted from the sample. Hereinafter, a scanning electron microscope of the electron microscope will be described as an example of the charged particle beam device, and the invention is not limited thereto and can be applied to other electron microscopes and other charged particle beam devices.

First Embodiment

FIG. 1 shows an overall schematic configuration of a scanning electron microscope according to a first embodiment. The scanning electron microscope generates an observation image of a sample 112 by irradiating the sample 112 with an electron beam 115 emitted from an electron source 101 while scanning the sample 112 and detecting secondary electrons, back scattered electrons, and the like emitted from the sample 112 by a detector 114. The observation image is generated by scanning the sample 112 with the electron beam 115 focused on a minute spot and associating a position irradiated with the electron beam 115 with a detection amount of the secondary electrons or the like. In the drawing, an emission direction of the electron beam 115 is set as a Z axis, and a horizontal axis orthogonal to the Z axis is set as an X axis.

The scanning electron microscope includes a cylindrical body 125 and a sample chamber 113, and an inside of the cylindrical body 125 is divided into a first vacuum chamber 126, a second vacuum chamber 127, and a third vacuum chamber 128 from a top. A diaphragm (not shown) through which the electron beam 115 passes is provided at a boundary portion of each vacuum chamber, and an inside of each vacuum chamber is maintained in a vacuum state by differential pumping. Hereinafter, a configuration of each vacuum chamber will be described.

The electron source 101 is disposed inside the first vacuum chamber 126. An SE electron source is used as the electron source 101. The SE electron source 101 is held by an insulator 116 and is electrically insulated from the cylindrical body 125. An extraction electrode 102 is disposed below (downstream of) the SE electron source 101 to face the SE electron source 101. An acceleration electrode 103 is disposed below the extraction electrode 102 to face the extraction electrode 102. The SE electron source 101, the extraction electrode 102, and the acceleration electrode 103 constitute an electron gun 104. An observation image is obtained by emitting the electron beam 115 from the SE electron source 101 and finally emitting the electron beam 115 onto the sample 112. A configuration of the SE electron source 101 will be described in detail later. The first vacuum chamber 126 is exhausted to vacuum by an ion pump 120 and a non-evaporable getter pump 118, and a pressure is set to ultra-high vacuum of about $10^{-8}$ Pa, more preferably extreme-high vacuum of $10^{-9}$ Pa or less.

A condenser lens 110 is disposed in the second vacuum chamber 127. The second vacuum chamber 127 is evacuated by an ion pump 121.

The detector 114 is disposed in the third vacuum chamber 128. An ion pump (not shown) is also disposed in the third vacuum chamber, and the third vacuum chamber is exhausted to vacuum.

An objective lens 111 and the sample 112 are disposed in the sample chamber 113. Although not shown, a scanning deflector or the like that scans the sample by the electron beam 115 is also disposed. The sample chamber 113 is exhausted to vacuum by a turbo molecular pump 109.

Hereinafter, an operation of each configuration described above and a process until the electron beam 115 emitted from the SE electron source 101 generates the observation image will be described.

A voltage is applied to each electrode of the electron gun 104 using a power supply (not shown). A positive extraction voltage $V_1$ with respect to the SE electron source 101 is applied to the extraction electrode 102, and the electron beam 115 is emitted from the SE electron source 101. A magnitude of the extraction voltage $V_1$ is typically about 1 kV to 10 kV, and more preferably about 2 kV to 6 kV. An acceleration voltage $V_0$ of about 0.5 kV to 100 kV is applied to the acceleration electrode 103 with respect to the SE electron source 101 to accelerate the electron beam 115. An electrostatic lens is formed between the extraction electrode 102 and the acceleration electrode 103 by a voltage difference.

The condenser lens 110 is disposed below the electron gun 104, focuses the electron beam 115 emitted from the electron gun 104, and adjusts a current amount and an aperture angle of the electron beam 115. A plurality of condenser lenses may be provided, and the condenser lens may be disposed in other vacuum chambers. Further, the electron gun 104 may be provided from the electron source 101 to the condenser lens 110.

Finally, the electron beam 115 is focused on the minute spot by the objective lens 111 disposed in the sample chamber 113 further below, and the sample 112 is irradiated with the electron beam 115 while being scanned by a scanning deflector (not shown). At this time, the secondary electrons, the back scattered electrons, and X-rays reflecting a surface shape and a material of the sample 112 are emitted from the sample 112. The secondary electrons, the back scattered electrons, and the X-rays are detected by the detector 114 to obtain the observation image of the sample. A plurality of detectors 114 may be provided, and the detector 114 may be disposed in other vacuum chambers such as the sample chamber 113.

Next, FIG. 2 shows a configuration of an SE electron source 201 in the related art as an SE electron source used in a general scanning electron microscope. The SE electron source 201 in the related art includes a single crystal wire (hereinafter, referred to as a tip) 202 that is an electron emission material, and a suppressor electrode 203.

The tip 202 is a single crystal wire having a tungsten <100> orientation and has a diameter of about 0.12 mm. A distal end of the tip 202 is sharpened, and a curvature radius of a distal end portion from which electrons are emitted is about 1 μm or less. Zirconium oxide is applied to a part such as a middle of the single crystal wire of the tip 202. The tip 202 is welded to a filament 206. Each of both ends of the filament 206 is connected to a corresponding one of terminals 207. The two terminals 207 are held by an insulator 208 and electrically insulated from each other. The two terminals 207 extend in a direction coaxial with the SE tip 202, and are connected to a current source via a feed-through (not shown).

In such a configuration, the tip 202 is heated from 1500 K to 1900 K by constantly passing a current through the terminals 207 and energizing and heating the filament 206. At this temperature, the zirconium oxide applied to the tip 202 diffuses and moves on a surface of the tip 202, and covers a (100) crystal plane at a center of the distal end of the tip 202 serving as the electron source. When the (100) plane is covered with zirconium oxide, a work function of this portion is reduced. Further, by applying the extraction voltage $V_1$ of about several kV to the extraction electrode 102 (shown in FIG. 1) disposed below the suppressor electrode 203 as described above, a strong extraction electric field of about $10^8$ V/m in a direction of a central axis Z is applied to the sharpened distal end of the tip 202. As a result, the Schottky effect is generated, and the work function is further reduced. As a result, thermal electrons are emitted from the heated (100) plane of the distal end of the tip 202, and the electron beam 115 is obtained.

The suppressor electrode 203 is, for example, a cup-shaped cylindrical metal having a bottom surface (plane) 205 as a typical shape. An opening 204 is disposed in the bottom surface (plane) 205. The suppressor electrode 203 and the opening 204 are coaxially processed, and central axes thereof coincide with each other. The central axis is the Z axis which is the same as the emission direction of the electron beam 115. The tip 202 is disposed inside the opening 204, and the distal end of the tip 202 is disposed to protrude from the opening 204 by a certain length T. Portions other than the distal end of the tip 202 are covered with the suppressor electrode 203.

The suppressor electrode 203 is assembled and held by fitting with the insulator 208. The suppressor electrode 203 and the terminals 207 are electrically insulated from each other by the insulator 208.

In the present example, the plane 205 is a plane portion perpendicular to the central axis Z. A diameter of the plane 205 is typically about 4 mm to 10 mm. A diameter d of the opening 204 is typically about 0.2 mm to 1.2 mm, and more preferably about 0.4 mm. A side surface of the suppressor electrode 203 typically has a cylindrical surface 210 parallel to the central axis Z of the suppressor electrode 203, and a chamfered portion 209 is formed at a connection portion between the plane 205 and the cylindrical surface 210.

As described above, the distal end of the tip 202 is disposed to protrude from the opening 204 by the length T. The protrusion length T of the distal end of the tip 202 is typically about 0.15 mm to 0.35 mm, and more preferably about 0.25 mm.

A negative suppressor voltage $V_3$ of typically −0.1 kV to −1.2 kV, more preferably about −300 V to −600 V with respect to the tip 202 is applied to the suppressor electrode 203. Unnecessary thermal electrons to be emitted from a portion other than the distal end portion of the tip 202, such as a root of the tip 202 or the filament 206, are prevented from being emitted due to an electric field formed by the negative suppressor voltage $V_5$. As a result, a high brightness performance and a high resolution performance of an electron beam 115 can be prevented from deteriorating due to the unnecessary thermal electrons.

A distance between the distal end of the tip 202 and the extraction electrode 102 shown in FIG. 1 is typically about 0.15 mm to 1.5 mm. A distance between the distal end of the tip 202 and the acceleration electrode 103 shown in FIG. 1 is typically about 1 mm to 50 mm.

Here, since the suppressor electrode 203 and the insulator 208 are assembled by the fitting, basically, the central axis of the tip 202 and the center axis of the opening 204 of the suppressor electrode 203 are integrally formed to coincide with each other. However, in a processing and forming process, a deviation occurs due to an influence of a mechanical tolerance, an assembly error, and distortion due to heat. Therefore, in reality, the central axis of the tip 202 and the central axis of the opening 204 may be shifted in a direction (X-axis direction or the like) orthogonal to the Z axis in the opening 204 of the suppressor electrode 203, and a shift amount, that is, a shift amount Δ (hereinafter, referred to as an axial shift amount) between a center of the opening 204 in a plane of the opening 204 of the tip 202 and the tip 202 is actually about several μm to several tens of μm, and the axial shift amount Δ is different for each individual electron source. Since the central axis of the suppressor electrode 203 and the central axis of the opening 204 are coaxially processed as described above, hereinafter, the axial shift between the tip 202 and the opening 204 may be referred to as an axial shift between the tip 202 and the suppressor electrode 203, and the same meaning is applied. Occurrence of such an axial shift Δ has an influence that a trajectory of the electron beam 115 is bent, and as a result, as will be described later, a problem such as occurrence of off-axis aberration due to an electron beam passing through outside an axis of a lens on a downstream side occurs.

Next, with reference to FIGS. 3A and 3B, an outline of a principle of bending of the electron beam 115 due to the axis of the tip 202 and the axis of the opening 204 of the suppressor electrode 203 being shifted from each other will be described. In FIGS. 3A and 3B, in the SE electron source 101 mounted on the scanning electron microscope, the distal end portion of the tip 202 is shown in an enlarged manner. The same reference numerals denote the same components as those described above, and a description thereof will be omitted.

FIG. 3A is a schematic diagram of an ideal case in which the axes of the tip 202 and the suppressor electrode 203 coincide with each other. When the central axes coincide with each other, as will be described later, only an electric field distribution symmetrical to the Z axis formed by the coaxial suppressor electrode 203 acts on the electron beam 115 emitted from the distal end of the tip 202, and the electron beam 115 travels straight in the Z direction by receiving an electric field action only in a Z direction which is a traveling direction of the electron beam 115, and travels along the central axis without being bent. Thereafter, since the electron beam 115 travels along the central axis of the opening of the extraction electrode 102 or the acceleration electrode 103, the off-axis aberration does not occur.

FIG. 3B is a schematic diagram in a case in which the suppressor electrode 203 is axially shifted with respect to the tip 202. It is shown that the suppressor electrode 203 is shifted in a right direction in the drawing as indicated by axis shift vectors 302 of the suppressor electrode 203. Further, the suppressor electrode 203 indicated by a broken line indicates a position when the axes are not shifted.

When the central axes of the tip 202 and the suppressor electrode 203 are shifted from each other, as will be described later, an electric field 301 in a direction (lateral direction) (X direction) perpendicular to the central axis is generated in a space in front of the tip 202 in an emission direction of the electron beam 115. The electron beam 115 emitted from the tip 202 receives a force not only in a Z-axis direction but also in the lateral direction by the electric field, and is bent. Thereafter, the electron beam 115 passes outside an axis of the electrostatic lens formed by the extraction electrode 102 and the acceleration electrode 103. As a result, the trajectory of the electron beam 115 is disturbed by the off-axis aberration, and a focused diameter when the beam is focused on the sample 112 is increased, thereby deteriorating resolution of the scanning electron microscope. The condenser lens 110 and the objective lens 111 are provided below the acceleration electrode 103. Since the electron beam 115 is bent, the off-axis aberration occurs even in these lenses, and resolution thereof is deteriorated.

Since the axial shift amount Δ of the electron source 101 is different for each individual, a bending magnitude of the electron beam 115 is also different for each individual. Therefore, the off-axis aberration and the resolution are changed for each scanning electron microscope on which the electron source is mounted, and a machine difference occurs. When there is a machine difference in the scanning electron microscope, for example, in a case in which a dimension of a pattern is measured using a semiconductor pattern as a sample, when the dimensions of the patterns having the same dimensions are measured using a plurality of electron microscopes, measurement results of different dimensions are obtained due to the machine difference in the scanning electron microscope used for the measurement, and reliability, accuracy, and reproducibility of the measurement are reduced. The problem of the machine difference is a problem that is likely to be more apparent with miniaturization of the semiconductor pattern.

Further, when the axial shift Δ is large and the bending magnitude of the electron beam 115 is particularly large, the electron beam 115 cannot pass through the openings of the extraction electrode 102 and the acceleration electrode 103 or other diaphragms (not shown), and cannot reach the sample 112. In this case, a manufacturing failure of the electron source, the electron gun, or the scanning electron microscope occurs, and a manufacturing cost and a lead time are increased.

In order to solve the above problem, in the first embodiment, a shape of a suppressor electrode 305 is different from that of the suppressor electrode 203 in the related art.

FIG. 4 shows the configuration of the SE electron source 101 and the suppressor electrode 305 according to the first embodiment. As shown in FIG. 4, unlike the suppressor electrode 203 in the related art, the suppressor electrode 305 according to the first embodiment includes a tapered surface (tapered portion) 306 at a position in the vicinity of the central axis Z of the plane 205 which is a lower surface (bottom surface) of the suppressor electrode 305. Due to an action of the tapered surface 306, the electron beam 115 is not bent even if the tip 202 and the suppressor electrode 305 are axially shifted from each other as described later.

The tapered surface 306 forms an angle (taper angle) θ with a surface perpendicular to the central axis Z. A corner portion 307 is formed at a connection portion between the tapered surface 306 and the plane 205 (front end portion 213). A diameter of a position from which the tapered surface 306 starts (corresponding to a position of the corner portion 307) as viewed from the central axis is denoted by L. The diameter L is a diameter of a plane portion 205 (the front end portion 213).

In other words, the configuration of the suppressor electrode 305 is expressed as follows. The suppressor electrode 305 has the central axis 2, and includes the front end portion 213 (plane 205) and a rear end portion 214 that are both end portions in a direction along the central axis Z, the front end portion 213 (plane 205) includes the opening 204 provided coaxially with the suppressor electrode 305, and the tip 202 is disposed in the opening 204. Here, a direction in which the distal end portion of the tip 202 is disposed to protrude from the opening 204 and the electron beam 115 is emitted is referred to as a front side, and a direction opposite thereto is referred to as a rear side. The configuration includes the tapered portion 306 that is a surface (receding portion (surface)) 212 receding in a direction farther from the distal end of the tip 202 than the front end portion 213 (plane 205) in the Z direction at a position of the front end portion 213 (plane 205) in an outer peripheral direction than the opening 204.

Compared to the suppressor electrode 203 in the related art, the suppressor electrode 305 includes the receding portion 212 (tapered surface 306) formed by making a surface in the vicinity of the central axis Z in a plane of the plane 205 recede, and a diameter of the plane portion 205 is smaller than that of the suppressor electrode in the related art.

Since the tapered surface 306 is present in the vicinity of the central axis Z, even if the tip 202 and the suppressor electrode 305 are axially shifted, the tapered surface 306 acts on an electric field distribution formed by the suppressor electrode 305, and the electron beam 115 is not bent as will be described later. The diameter L and the angle θ, which are parameters of the shape of the suppressor electrode, have an appropriate design range as will be described later.

Similarly to the SE electron source 201 in the related art, the suppressor electrode 305 is assembled and held by fitting with the insulator 208.

An effect obtained by a structure of the suppressor electrode according to the first embodiment will be described. FIGS. 5A to 5D are explanatory diagrams showing a principle that the electron beam 115 is not bent even if the tip 202 and the suppressor electrode 305 are axially shifted in the SE electron source 101 according to the first embodiment. FIGS. 5A and 5B show a state in which the suppressor electrode 203 of a related-art type is used, and FIGS. 5C and 5D show a state in which the suppressor electrode 305 according to the first embodiment is used. FIGS. 5A and 5C show a case in which the tip 202 and the opening 204 are not axially shifted, and FIGS. 5B and 5D show a case in which the tip 202 and the opening 204 are axially shifted.

First, FIG. 5A is a schematic diagram showing an electrical flux line in the case in which there is no axial shift in the SE electron source 201 in the related art. The electrical flux line is a virtual line indicating a direction of an electric field generated in a space, and indicates a direction of a force applied to the electrons.

As described above, the negative voltage is applied to the suppressor electrode 203 with respect to the tip 202 and the extraction electrode 102. As a result, a plurality of positive electrical charges 401 are generated on a surface of the tip 202, and a plurality of negative electrical charges 402 are generated on a surface of the suppressor electrode 203. Therefore, the electrical flux line 403 is generated from the electrical charges 401 toward the negative electrical charges 402. In the state in which there is no axial shift in FIG. 5A, the tip 202 and the suppressor electrode 203 have an axially symmetrical structure with respect to the central axis. In this case, there is no electrical flux line crossing the central axis, and a force in the lateral direction is not applied to the electron beam 115 emitted from the distal end of the tip 202. Therefore, the electron beam 115 is not bent.

FIG. 5B is a schematic diagram showing an electrical flux line added when the axes are shifted in the SE electron source 201 in the related art. The shift of the suppressor electrode 203 with respect to the tip 202 corresponds to addition of new electrical charges to the state of FIG. 5A.

It is assumed that the suppressor electrode 203 is shifted from the state of FIG. 5A to the state of FIG. 5B by a slight amount (axial shift amount Δ) in a direction indicated by the axis shift vectors 302, that is, in the right direction in the drawing. In FIG. 5B, a broken line indicates a position of the suppressor electrode 203 before the axial shift, and a solid line indicates a position of the suppressor electrode 203 after the axial shift. Strictly speaking, the axial shift amount Δ is defined as a shift between the central axis of the opening 204 of the suppressor electrode and the central axis of the tip 202 in the plane of the opening 204, and is simply shown as a displacement amount when a position of an opening end portion of the opening 204 changes (displaces) from the state before the axial shift to the axially shifted state in FIGS. 5A to 5D, which is a substantially similar amount.

In the opening 204, attention is focused on a spatial region 406 in which the suppressor electrode 203 approaches the tip 202. Movement of the suppressor electrode 203 to the spatial region is equivalent to addition of new negative electrical charges 405 to this space due to the axial shift. In addition, since a space on a left side of the spatial region 406 in the drawing is inside the suppressor electrode 203, no electrical charge is generated. Therefore, positive electrical charges 420 that cancel the negative electrical charges 402 before the axial shift are also added. Further, in the spatial region 406, a distance between the suppressor electrode 203 and the tip 202 is reduced. Therefore, electrostatic capacitance increases, and the number of negative electrical charges in the space increases as compared to that before the axial shift. That is, the number of the negative electrical charges 405 is larger than that of the positive electrical charges 420.

Meanwhile, in the opening 204, attention is focused on a spatial region 407 in which the suppressor electrode 203 is separated from the tip 202. A fact that the suppressor electrode 203 disappears from the spatial region is equivalent to a fact that new positive electrical charges 404 are added to this portion to cancel negative electrical charges 421 before the axial shift. In addition, since a right side of the spatial region 407 in the drawing newly becomes a surface of the suppressor electrode 203, negative electrical charges 422 are added thereto. Further, in the spatial region 407, the distance between the suppressor electrode 203 and the tip 202 is increased. Therefore, the electrostatic capacitance is reduced, and the number of negative electrical charges in the space is reduced as compared to that before the axial shift. That is, the number of positive electrical charges 404 is larger than that of the negative electrical charges 422.

In this way, the axial shift of the suppressor electrode 203 is equivalent to the addition of the negative electrical charges 405, the positive electrical charges 420, the positive electrical charges 404, and the negative electrical charges 422 shown in FIG. 5B to a charge distribution in the state in which there is no axial shift shown in FIG. 5A.

Here, in FIG. 5B, the positive electrical charges 404 and the negative electrical charges 405 are exposed on a vacuum side surface of the suppressor electrode 203, have a large electrical charge amount, and generate a strongest electric field in a vacuum region. As a result, a new electrical flux line 408 connecting both types of electrical charges is generated in front of the tip 202. The electrical flux line 408 is generated in the lateral direction (X direction in the drawing) to cross the central axis, and applies a force to the electron beam emitted from the tip 202. As a result, the electron beam is bent to the right side in the drawing. This is the principle that the electron beam is bent due to the axial shift of the suppressor electrode 203.

FIG. 5C is a schematic diagram showing an electrical flux line in the SE electron source 101 according to the first embodiment when there is no axial shift. The SE electron source 101 according to the first embodiment has the tapered surface 306 on the lower surface of the suppressor electrode 305 in the vicinity of the axis. When there is no axial shift, as in FIG. 5A, the positive electrical charges 401 and the negative electrical charges 402 are generated axially symmetrically, and the electrical flux line 403 is generated. Also in this case, the electrical flux line crossing the central axis is not generated, and the electron beam 115 is not bent.

FIG. 5D is a schematic diagram showing an electrical flux line added when the axes are shifted to the right side in the drawing by the axial shift amount Δ in the SE electron source 101 according to the first embodiment. In the SE electron source 101 according to the first embodiment, by providing the tapered surface 306, electrical charges are also generated on the tapered surface, and an electrical flux line 412 in a direction opposite to that of the electrical flux line 408 is generated. As a result, the force of bending the electron beam is alleviated, and a force of bending back the electron beam is generated. In the drawing, broken lines indicate the position of the suppressor electrode 305 before the axial shift as in the case shown in FIG. 5C, and solid lines indicate the position of the suppressor electrode 305 after the axial shift.

FIG. 5D will be described in more detail. Also in the SE electron source 101 according to the first embodiment, when the tip 202 and the suppressor electrode 305 are axially shifted with each other, the new positive electrical charges 404 and the new negative electrical charges 422, and the new negative electrical charges 405 and the positive electrical charges 420 are generated in the opening 204, and the electrical flux line 408 is generated.

Here, in the SE electron source 101 according to the first embodiment, the equivalent electrical charges are also generated in the tapered surface 306 due to the axial shift. Attention is focused on a spatial region 413 from which the tapered surface 306 approaches the tip 202. Absence of the suppressor electrode 305 in this space is equivalent to addition of new positive electrical charges 410 to cancel the negative electrical charges 402 before the axial shift. In addition, a space on a right side of the spatial region 413 in the drawing newly becomes the surface of the tapered surface 306, and thus negative electrical charges 423 are added thereto. Further, in the spatial region 413, the tapered surface 306 approaches the tip 202. As a result, an influence of the electric field on the tapered surface 306 by the tip 202 increases, and an influence of the electric field on the tapered surface 306 by the extraction electrode 102 (not shown) decreases. Since a voltage applied to the extraction electrode 102 is higher than that applied to the tip 202, the electric field of the tapered surface 306 is reduced. That is, the number of positive electrical charges 410 is larger than the number of negative electrical charges 423.

Further, attention is focused on a spatial region 414 in which the tapered surface 306 is separated from the tip 202. Movement of the suppressor electrode 305 into this space is equivalent to addition of new negative electrical charges 411 thereto. Since a left side of the spatial region 414 is inside the suppressor electrode 305, positive electrical charges 424 that cancel the negative electrical charges before the axial shift are added. Further, in the spatial region 414, the tapered surface 306 is separated from the tip 202. As a result, the influence of the electric field on the tapered surface 306 by the tip 202 decreases, and the influence of the electric field on the tapered surface 306 by the extraction electrode 102 (not shown) increases. Since the voltage applied to the extraction electrode 102 is higher than that applied to the tip 202, the electric field of the tapered surface 306 increases. That is, the number of the negative electrical charges 411 is larger than that of the positive electrical charges 424.

In this way, on the surface of the tapered surface 306, the number of the positive electrical charges 410 is large in the spatial region 413, and the number of the negative electrical charges 411 is large in the spatial region 414. As a result, the new electrical flux line 412 connecting the positive electrical charges 410 and the negative electrical charges 411 is generated. The direction of the electrical flux line 412 is opposite to the direction of the electrical flux line 408 generated in the opening 204. This can weaken the electric field generated in the opening 204, reduce the force applied by the electrical flux line 408, and make the electron beam difficult to bend.

In addition, as the electrical charge amounts of the positive electrical charges 410 and the negative electrical charges 411 generated on the tapered surface 306 are larger, or as the distance between the positive electrical charges 410 and the negative electrical charges 411 is shorter, the electric field generated by both the positive electrical charges 410 and the negative electrical charges 411 becomes stronger, and the force applied by the electrical flux line 412 also becomes stronger. Therefore, by setting the electrical charge amount and the distance to appropriate amount values, the electron beam bent due to the electrical flux line 408 can be bent back by the electrical flux line 412, and the electron beam can be returned onto the central axis.

On the other hand, if the electrical charge amount is excessively increased or the distance is excessively reduced, the force of the electrical flux line 412 becomes excessively stronger than the force of the electrical flux line 408, and the electron beam is bent to the left in the drawing. When the force of the electrical flux line 412 is excessive, a degree to which the electron beam is bent is increased as compared to the case in which the suppressor electrode 203 is axially shifted in the related art, the influence of the axial shift is larger than that in the related art, and the problem is rather deteriorated.

The electrical charge amounts of the positive electrical charges 410 and the negative electrical charges 411 generated on the tapered surface 306 and the distance between both types of the electrical charges are determined by the diameter L of a start position of the tapered surface 306 shown in FIG. 4 and the angle θ of the tapered surface 306. The diameter L determines the distance between the positive and negative electrical charges generated on the tapered surface 306. The angle θ determines a degree of electric field concentration at the tapered surface 306 and the corner portion 307 thereof, and determines the electrical charge amount generated at the tapered surface 306 and the corner portion 307. Therefore, it is necessary to design the diameter L and the angle θ in an appropriate range in order to prevent the electron beam from being bent even if the axes are shifted.

Here, the electric field generated by the electrical charges generated on the surface becomes weak in inverse proportion to the distance between the positive and negative electrical charges, that is, the distance between the surfaces. Therefore, in order to generate a sufficient electric field on the central axis by the tapered surface 306, it is necessary to provide the tapered surface 306 in the vicinity of the central axis. That is, the diameter L needs to be equal to or less than a certain distance. Although the suppressor electrode 203 in the related art is provided with the chamfered portion 209, it is usually intended to avoid the electric field concentration at the corner portion of the suppressor electrode 305, and the diameter of the start position of the chamfered portion 209, that is, the diameter L of the plane 205 is not considered and typically has a large diameter of 4 mm or more. When the diameter L is large as described above, no matter what kind of structure is provided outside the plane 205, the electric field generated on the central axis by this structure is extremely small, and does not affect the electron beam 115. Therefore, in the suppressor electrode 203 in the related art, there is no influence even if the chamfered portion 209 has any shape or angle. When the diameter of the plane 205 is large as described above, the electric field in the lateral direction and the bending of the electron beam 115 are determined only by the electric field formed by the opening 204.

The above-described principle that the electron beam 115 is not bent can also be implemented by providing a shape different from that of FIG. 4 in the vicinity of the central axis. In a configuration shown in FIG. 5D, essentially, a surface (the receding portion (surface) 212) that faces rearward (upward in the drawing) from the lowermost surface 205 (the front end portion 213) of the suppressor electrode is provided at a position in the vicinity of the central axis in the outer peripheral direction from the opening 204 of the suppressor electrode 305, thereby generating the electrical charges here when the axes are shifted and generating an electric field in the opposite direction. As a result, the electric field formed in the opening 204 is cancelled, and further, the electron beam 115 is not bent by bending back the electron beam. In other words, the direction from the tip 202 toward the sample is the front side and the opposite direction is the rear side, at a position in the vicinity of the central axis Z in the outer peripheral direction than the opening 204 of the suppressor electrode 305, a surface (receding surface) (tapered portion 306 in the first embodiment) receding backward of a foremost surface (front end portion) 213 of the suppressor electrode 305, that is, a portion further separated (away) from the distal end of the tip 202 in the central axis direction than the front end portion 213 is provided as a part of the receding portion 212. As a result, an electric field in a direction opposite to the electric field generated by the opening 204 at a time of axial shift is generated by a portion (the tapered portion 306 in the first embodiment) of the receding surface 212 in the vicinity of the central axis. As a result, the electron beam can be prevented from being bent.

As examples of the receding surface other than the taper 306 in FIG. 4, a stepped step (corresponding to θ=90 degrees (°)), a curved surface such as a sphere or an ellipse, or a surface obtained by combining a plurality of tapers, steps, or curved surfaces may be used. The stepped step can be considered as a tapered portion having a taper angle of 90°, and the curved surface such as a sphere or an ellipse can be considered as a kind of tapered portion formed by a large number of minute portions having different taper angles that continuously change. Other shapes will be described later as other embodiments.

Hereinafter, the L and the θ of the suppressor electrode 305, which are shape parameters, a relationship between the axial shift amount Δ between the suppressor electrode 305 and the tip 202 and a bending amount (displacement in the X direction in FIGS. 5A to 5D) of the trajectory of the electron beam 115, and the appropriate design range of the shape parameters of the suppressor electrode 305 will be described.

First, FIGS. 6A and 6B show examples of an influence of the angle θ of the tapered surface 306 on the bending exerted on the electron beam 115 in the lateral direction (displacement in the X direction) in the SE electron source 101 according to the first embodiment.

FIG. 6A is a result obtained by calculating an electric field $E_x$ that is generated on the central axis Z in a direction (X direction, lateral direction) perpendicular to the central axis when the angle θ of the tapered surface 306 is changed from 0° to 14°. Here, the central axis of the tip 202 is the Z axis, the direction perpendicular to the Z axis is the X axis, a distal end surface of the tip 202 is Z=0, and a sample side is Z>0. As an example of calculation conditions, the diameter L of the front end portion 213 (plane 205) of the suppressor electrode 305, the protrusion length T of the tip 202, the diameter d of the opening 204, and the axial shift amount Δ between the tip 202 and the suppressor electrode 305 are set to L=800 μm, T=250 μm, d=400 μm, and Δ=1 μm, respectively, a potential of the tip 202 is set to 0 V, and the extraction voltage $V_1$ is set to 2 kV. The suppressor voltage $V_s$ is adjusted such that the electric field in the central axis direction (Z direction) applied to the distal end of the tip 202 is equal in each shape. The electric field $E_x$ in the lateral direction is normalized with an absolute value of a maximum electric field at θ=0° being 1. θ=0° is a condition in which there is no tapered surface 306, and is a shape of the suppressor electrode 203 in the related art. The above calculation conditions are examples as described above, and even if various parameters (calculation conditions) are changed, a tendency of an effect of reducing the bending of the electron beam can be considered as will be described later.

When θ=0°, the maximum electric field of $E_x=-1$ is generated in the vicinity of the distal end of the tip 202, and the electric field decreased as Z increases. In the vicinity of Z=800 μm, $E_x$ is almost 0. When θ is 2, the electric field at the distal end of the tip 202 decreases. When θ is increased to 6°, 10°, and 14°, the electric field at the distal end of the tip 202 is gradually weakened, and in addition, an electric field on a +side is generated with the vicinity of Z=200 μm being a vertex. Since a polarity of the electric field is reversed, the electric field on the +side acts to pull back the electron beam once bent in the vicinity of the tip.

FIG. 6B is a calculation result of the trajectory of the electron beam when the angle θ of the tapered surface 306 is changed from 0° to 14°. FIG. 6B indicates a position (a displacement amount or an axis offset distance X) in the X direction of the trajectory of the electron beam with respect to a distance Z on the Z axis. A rate of change (dX/dZ) of a vertical axis X with respect to a horizontal axis Z is inclination of the trajectory of the electron beam. In the drawing, Z is indicated up to 20 mm, and the vicinity of the acceleration electrode 103 on a downstream side is shown. In addition, the vertical axis X is normalized with the axis offset distance X of the electron beam at Z=20 mm as 1 in the suppressor electrode in the related art at θ=0°. The parameters such as the shape of the suppressor electrode 305 are the same as those in FIG. 6A.

In a case of the suppressor electrode in the related art of θ=0°, the electron beam is bent to the +side, and moves away from the central axis as Z increases. As the θ is increased, the inclination (dX/dZ) of the electron beam is reduced, and an axis offset amount X is also reduced. When the inclination (dX/dZ) of the electron beam at Z=20 mm is compared to the case in the related art, the inclination at θ=2, 6, and 10° is 80%, 39%, and 0.1%, respectively. That is, in a case of θ=10°, even if the tip 202 and the suppressor electrode 305 are axially shifted, the electron beam is hardly bent. Since the electron beam is not bent, the electron beam travels on the central axis, and the off-axis aberration does not occur in the electrostatic lens or other lenses. On the other hand, when θ=14°, the force for bending back the electron beam is excessively strong, and the electron beam is inclined to a −side. When the θ is further increased, the electron beam is further inclined to the −side, and the bending amount of the electron beam may be deteriorated as compared to the case in the related art. In this way, in order to reduce the bending of the electron beam as compared to that in the related art, it is necessary to set the θ within a certain range.

Next, with reference to FIGS. 7A to 7C, examples of an influence when the axial shift amount Δ between the tip 202 and the suppressor electrode 305 increases in the SE electron source 101 according to the first embodiment will be described.

FIG. 7A shows a result obtained by calculating the electric field $E_x$ in the direction (X direction, lateral direction) perpendicular to the central axis Z generated on the central axis Z when the axial shift amount Δ increases from 1 μm to 20 μm in the SE electron source 201 using the suppressor electrode 203 in the related art. The electric field $E_x$ in the lateral direction is normalized with the absolute value of the maximum electric field in the case of the axial shift Δ=1 μm being 1.

$E_x$ increases substantially in proportion to the axial shift amount Δ, and a distribution thereof is similar. The absolute values of the maximum values of $E_x$ at the axial shift amounts Δ=1 μm, 5 μm, 10 μm, and 20 μm are 1, 5, 10, and 20. Therefore, the lateral electric field $E_x$ increases in proportion to the axial shift amount Δ, and the electron beam is greatly bent.

FIG. 7B is a calculation result of the electric field $E_x$ in the lateral direction when the axial shift amount Δ increases under the condition of θ=10° in the SE electron source 101 using the suppressor electrode 305 according to the first embodiment. The other conditions used for the calculation are the same as the conditions described with reference to FIGS. 6A and 6B.

Also in the SE electron source 101 according to the first embodiment, $E_x$ is increased in proportion to the axial shift amount Δ, and a distribution thereof is similar. However, in the SE electron source 101 according to the first embodiment, the electric field on the +side having a vertex in the vicinity of Z=200 μm is also increased in proportion to the axial shift amount Δ. As a result, even if the axial shift amount Δ increases, the force for bending back the electron beam also increases accordingly, and the state in which the electron beam is not bent is maintained.

In FIG. 7C, for the SE electron source 201 in the related art and the SE electron source 101 according to the first embodiment, the axial shift amount Δ is shown on a horizontal axis, and the inclination (dX/dZ) of the electron beam at the position of Z=20 mm is shown on a vertical axis. The shape of the suppressor electrode 305 according to the first embodiment of FIG. 7C is the same as that of FIG. 7B. The inclination (dX/dZ) of the electron beam on the vertical axis is normalized with the inclination at Z=20 mm at the axial shift amount Δ=1 μm being 1 in the SE electron source 201 using the suppressor electrode 203 in the related art.

In the suppressor electrode 203 in the related art, the inclination (dX/dZ) of the electron beam is increased in proportion to the axial shift amount Δ. In contrast, in the suppressor electrode 305 according to the first embodiment, the inclination of the electron beam is substantially 0 even if the axial shift amount Δ is increased. In this way, even if the suppressor electrode 305 according to the first embodiment is axially shifted, a state in which the electron beam 115 is not bent can be implemented.

Further, in the related art, a standard is set in an assembly process of the electron source and quality control is performed such that the axial shift amount between the tip 202 and the suppressor electrode 203 is equal to or less than a certain value. Among the manufactured electron sources, an individual in which the axial shift amount Δ cannot be equal to or less than the certain value is a manufacturing failure. In contrast, by using the suppressor electrode 305 according to the first embodiment, since the electron beam 115 is not bent even if the axial shift amount Δ is large, the standard of the assembly process can be greatly relaxed. The suppressor electrode 305 has effects such as a reduction in manufacturing cost of the electron source, an improvement in yield, and a reduction in a lead time.

Based on the above results, an appropriate design of the shape of the suppressor electrode 305 according to the first embodiment will be further studied.

An appropriate relationship between the L and the θ in the SE electron source 101 using the suppressor electrode 305 according to the first embodiment will be described with reference to FIGS. 8A and 8B. FIG. 8A shows a result obtained by calculating the inclination (dX/dZ) of the electron beam 115 at Z=20 mm obtained when the L and the θ are changed in the suppressor electrode 305 according to the first embodiment. Contour lines connecting points having the same inclination of the electron beam are displayed with a horizontal axis representing the L and a vertical axis representing the θ. The inclination of the electron beam is indicated by percentage compared to the inclination of the electron beam of the SE electron source 201 in the related art using the suppressor electrode 203 in the related art. Lines of 90%, 50%, 0%, −50%, and −90% in the drawing indicate that the inclination of the electron beam is 90%, 50%, 0%, −50%, and −90%, respectively, as compared to the SE electron source 201 in the related art. The sign − means that the inclination of the electron beam is reversed compared to the one in the related art. Other conditions used for the calculation are the same as those in FIGS. 6A and 6B.

In principle, in the SE electron source 101 according to the first embodiment, the electric field generated by the tapered surface 306 becomes stronger as the L becomes shorter or the θ becomes larger. Conversely, when the L is excessively large or the θ is excessively small, the electric field generated by the tapered surface 306 becomes very weak, and the effect of reducing the inclination of the electron beam becomes negligibly small as compared to that in the related art. On the other hand, when the L is excessively small or the θ is excessively large, the electric field generated by the tapered surface 306 becomes very large, and the inclination of the electron beam becomes very large in the opposite direction as compared to that in the related art. In this case, the electron beam is greatly bent in the opposite direction as compared to the SE electron source 201 in the related art. Therefore, it is necessary to design the diameter L and the angle θ within an appropriate range.

As an effect of the SE electron source 101 using the suppressor electrode 305 according to the first embodiment, it is desirable to design the L and the θ within ranges surrounded by a line of 90% and a line of −90% shown in FIG. 8A using, as a threshold, the absolute value of the inclination of the electron beam 115 being reduced by 10% or more as compared to the case in the related art, that is, the absolute value of the inclination being 90% or less as compared to the case in the related art.

More preferably, it is desirable to design the L and the θ within ranges surrounded by a line of 50% and a line of −50% shown in FIG. 8A using, as the threshold, the absolute value of the inclination of the electron beam 115 is reduced by 50% or more compared to the case in the related art, that is, the absolute value of the inclination being 50% or less compared to the case in the related art.

More preferably, it is desirable to perform the design under the condition on the line of 0% shown in FIG. 8A such that the inclination of the electron beam 115 is 0% of the case in the related art, that is, the electron beam does not bend at all.

The angle θ of the tapered surface 306 is preferably 90°, which is maximum. When θ=90°, the shape of the tapered surface 306 can be regarded as a stepped step rather than a taper. As shown in FIG. 8A, under the condition of θ=90°, the L at which the inclination of the electron beam is 90% of that in the related art is about 2540 μm. Since the electric field generated by the tapered surface 306 becomes weak at the others θ, it is necessary to make the L smaller than 2540 μm in order to obtain the inclination of 90%. Therefore, in order to obtain the inclination of the electron beam of 90% or less, it is necessary to set the L to 2540 μm or less at any angle. This is one standard when the tapered surface 306 is disposed in the vicinity of the axis.

Similarly, under the condition of θ=90°, the L at which the inclination of the electron beam is 50% of that in the related art is about 1940 μm. Therefore, in order to obtain the inclination of the electron beam of 50% or less, it is necessary to set the L to 1940 μm or less at any angle.

Similarly, under the condition of θ=90°, the L at which the inclination of the electron beam is 0% is 1650 μm. Therefore, in order to obtain the inclination of the electron beam of 0%, it is necessary to set the L to 1650 μm or less at any angle.

FIG. 8B is a diagram in which the vertical axis of FIG. 8A is represented by log θ. A unit of the θ is degree (°), and a unit of the L is μm. The lines of 90%, 50%, 0%, −50%, and −90% are approximated by the following quadratic functions, respectively, when the vertical axis is represented by log θ.

The lines of 90%, 50%, 0%, −50%, and −90% are expressed in order as follows.

$\log θ = 2.40 \times 10^{-7} \times L^2 + 3.18 \times 10^{-4} \times L - 4.08 \times 10^{-1}$ $\log θ = 3.80 \times 10^{-7} \times L^2 + 6.77 \times 10^{-5} \times L + 3.92 \times 10^{-1}$ $\log θ = 4.96 \times 10^{-7} \times L^2 - 8.31 \times 10^{-5} \times L + 7.43 \times 10^{-1}$ $\log θ = 5.86 \times 10^{-7} \times L^2 - 1.81 \times 10^{-4} \times L + 9.49 \times 10^{-1}$ $\log θ = 6.68 \times 10^{-7} \times L^2 - 2.68 \times 10^{-4} \times L + 1.08$ Therefore, another standard is to design the SE electron source 101 according to the first embodiment using the L and the θ within the ranges defined by the above expressions. For example, when the inclination of the electron beam is reduced from 90% to −90% of that in the related art, the design may be performed to satisfy a relationship of $2.40 \times 10^{-7} \times L^2 + 3.18 \times 10^{-4} \times L - 4.08 \times 10^{-1} \leq \log θ \leq 6.68 \times 10^{-7} \times L^2 - 2.68 \times 10^{-4} \times L + 1.08$ by using the above expressions in cases of 90% and −90%.

Here, the appropriate range shown in FIGS. 8A and 8B changes by about +−20% depending on other conditions such as the protrusion length T of the tip, the diameter of the opening 204, the shapes of the tip and the extraction electrode, the suppressor voltage, and the extraction voltage. In addition, it is difficult to set a standard for each of these conditions in a classified manner. Therefore, it should be noted that the above range is not strict, has a certain likelihood, and may change.

For example, this calculation is a result at a case of the protrusion length T=250 μm of the tip 202, and the influence of the electric field 301 in the lateral direction increases or decreases in inverse proportion to the protrusion length. As a result, the degree to which the electron beam is bent changes, and the appropriate ranges of the L and the θ also change. When the T is a value close to 250 μm, which is about 200 μm to 300 μm, the inclination of the electron beam can be reduced as compared to that in the related art by performing the design within the ranges of the L and the θ shown in FIGS. 8A and 8B. However, when the protrusion length T is out of this range, an appropriate L. and an appropriate θ are insufficient in the ranges of FIGS. 8A and 8B. A case in which these projection lengths are different will be described later.

This calculation is a result of the diameter of the opening 204 being 400 μm, and for example, when the diameter of the opening 204 is increased, the influence of the electric field applied to the opening 204 by the extraction electrode 102 is increased, and the electrical charge amounts of the positive electrical charges 404 and the negative electrical charges 405 are increased. As a result, the electron beam 115 is bent more greatly. At this time, in order to prevent the electron beam 115 from bending, it is necessary to set the angle θ larger and the diameter L smaller than the ranges shown in FIGS. 8A and 8B. By performing the same calculation as described above, it is found that, for example, the diameter L needs to be reduced by about 20% when the diameter of the opening 204 is 600 μm.

Next, the suppressor voltage required for the SE electron source 101 using the suppressor electrode 305 according to the first embodiment will be described. FIG. 9 shows a result obtained by calculating the suppressor voltage required to make the electric field applied to the distal end of the tip 202 in the central axis direction (Z direction) the same as that in the related art when the diameter L is changed under the condition of θ=10°. The other calculation conditions are the same as those in FIGS. 6A and 6B. A vertical axis is normalized with the suppressor voltage applied to the SE electron source 201 using the suppressor electrode 203 in the related art being 1.

Since the suppressor electrode 305 according to the first embodiment has the receding surface 212 such as the tapered surface 306 in the vicinity of the central axis, the effect of preventing the electric field applied to the distal end of the tip 202 in the central axis direction (Z direction), which is an original purpose of the suppressor electrode 305, is weakened. That is, an extraction/acceleration electric field applied to the distal end of the tip 202 in the central axis direction is strong. In this case, problems arise in that the effect of preventing unnecessary electrons, which is a function of the suppressor electrode, is reduced, and the unnecessary electrons are emitted excessively as compared to that in the related art. In order to cope with the problems, in the first embodiment, it is necessary to make the suppressor voltage $V_s$ higher than that in the related art and make the electric field of the distal end of the tip 202 in the central axis direction the same as that in the related art.

A calculation result of L=400 μm shown in FIG. 9 is a condition under which the start position of the tapered surface 306 is matched with a lower surface of the opening 204, which means there is no plane 205. In this case, the required suppressor voltage is 1.54, and it is necessary to increase the voltage by 54% as compared to that in the related art. This causes problems such as an increase in a power supply cost and an increase in a risk of discharge on a surface of the insulator 208. In addition, since the opening 204 and the start position of tapered surface 306 coincide with each other, an electric field is concentrated at this point, and a risk of spatial discharge with the extraction electrode 102 is increased. When the discharge occurs, the distal end of the tip 202 is eroded, and the electron source becomes unusable. In addition, the protrusion length T of the tip is usually adjusted and assembled under a stereomicroscope using the plane 205 as a standard plane. Without the plane 205, it becomes difficult to adjust the protrusion length, resulting in a problem of deterioration in yield and an increase in the manufacturing cost.

As shown in FIG. 9, the required suppressor voltage is reduced by making the diameter L larger than 400 μm, that is, by making the diameter of the plane 205 larger. In addition, the problem when there is no plane 205 can be solved. In particular, a graph shown in FIG. 9 is convex downward, and there is an advantage that the required suppressor voltage can be greatly reduced by slightly increasing L.

As one standard of a magnitude of L, when a threshold is set to be equal to or less than 27%, which is half of 54% of an increase amount of the suppressor voltage required in the case of L=400 μm, that is, set to be equal to or less than 1.27 on the vertical axis of FIG. 9, the L at which the threshold is implemented is 720 μm or more. Therefore, by setting the L to 720 μm or more, an increase in the required suppressor voltage can be reduced to half or less as compared to the case in which there is no plane 205. In this way, in a typical suppressor electrode in which the diameter d of the opening 204 is about 400 μm, setting the L to 720 μm or more is one indicator.

More preferably, a threshold is set to be 18% or less (1.18 or less on the vertical axis), which is one third of 54% of the increase amount of the suppressor voltage required when L=400 μm. The L at which the threshold is implemented is 910 μm or more. Therefore, by setting the L to 910 μm or more, the increase in the required suppressor voltage can be reduced to one third or less as compared to the case in which there is no plane 205.

When the L is set to 2000 μm or more, the required suppressor voltage is 1.01 or less, which is almost the same as that in the related art. However, as described above, the electric field generated by the tapered surface 306 decreases in inverse proportion to L. Therefore, there is a trade-off relationship between the reduction of the required suppressor voltage by increasing the L and the prevention of the bending of the electron beam. A designer determines an allowable value of the bending amount of the electron beam and an allowable value of the increase in the suppressor voltage in view of the entire device design, and determines an appropriate L based on the allowable values. Thereafter, the θ is determined to reduce the bending of the electron beam within a desired range. Alternatively, an adjustment standard of an assembly error of the central axes of the tip 202 and the suppressor electrode 305 is alleviated.

Although this calculation is performed for θ=10°, the same calculation is performed for the other angles θ, and as a result, a calculation result similar to FIG. 9 is obtained. Therefore, for the others θ, by setting the above-described L to 720 μm or more, the required increase in the suppressor voltage can be reduced to half or less as compared to that in the case in which there is no plane 205 at the θ. In addition, by setting the L to 910 μm or more, the required increase in the suppressor voltage can be reduced to one third or less as compared to that in the case in which there is no plane 205 at the θ.

Second Embodiment

In the first embodiment, under a condition that the protrusion length T of the tip 202 is about 200 μm to 300 μm, the tapered surface 306 is provided on the suppressor electrode 305 to prevent an electron beam from being bent at a time of axial shift. In a second embodiment, the suppressor electrode 305 and the SE electron source 101 having the same structure as that of the first embodiment are used, and a configuration in which the protrusion length T of the tip 202 is out of the above-described range described in the first embodiment will be described.

FIG. 10 shows the electric field $E_x$ in a lateral direction when the protrusion length T of the tip 202 is changed in the SE electron source 201 using the suppressor electrode 203 in the related art. FIG. 10 shows calculation results when the T is changed to 150 μm, 250 μm, and 350 μm. The result of T=250 μm corresponds to a result of θ=0° shown in FIG. 6A according to the first embodiment. In addition, Z=0 is a position of a distal end surface of the tip 202 at T=250 μm. Therefore, the distal end surface of the tip 202 at T=150 μm is Z=−100 μm, and the distal end surface of the tip 202 at T=350 μm is Z=100 μm. As calculation conditions, a diameter d of the opening 204 is set to 400 μm, and the extraction voltage $V_1$ is set to 2 kV. The suppressor voltage $V_s$ is adjusted such that the electric field in the central axis direction (Z direction) applied to the distal end of the tip 202 is equal in each shape. The axial shift amount Δ between the tip 202 and the suppressor electrode 203 is set to 1 μm. The electric field $E_x$ in the lateral direction, which is a vertical axis, is normalized with an absolute value of a maximum electric field at T=250 μm being 1.

When the T is changed, the electric field formed by the opening 204 in the lateral direction is greatly changed. A value of a peak of the electric field at T=250 μm is −1, whereas a value of the peak of the electric field at T=150 μm is −3.4 and a value of the peak of the electric field at T=350 μm is −0.33. This is because a region in which the electrical flux line 408 shown in FIG. 5B is shielded changes depending on the protrusion length T of the tip 202.

When the protrusion length T of the tip 202 is set to be shorter than 250 µm, the electric field also enters a region in which there is no tip 202, and the electron beam is further bent. Therefore, in order to prevent bending of the electron beam, it is necessary to strengthen the electric field 412 in an opposite direction shown in FIG. 5D. In order to implement the strong electric field, it is necessary to further shorten the diameter L of the tapered surface 306 or to further increase the angle θ.

When the protrusion length T of the tip 202 is set to be larger than 250 µm, the electric field in a region in which the tip 202 moves is shielded, and the electron beam is less likely to be further bent. Therefore, the electron beam may be excessively bent back at the L and the θ shown in the first embodiment, and inclination of the electron beam is deteriorated as compared to that in the related art. Therefore, the L of the tapered surface 306 needs to be larger or the θ needs to be smaller.

An appropriate relationship between the L and the θ when the protrusion length T is set to 150 µm in the SE electron source 101 using the suppressor electrode 305 according to the second embodiment will be described with reference to FIGS. 11A and 11B. FIG. 11A shows a result obtained by calculating the inclination of the electron beam obtained when the L and the θ are changed under a condition of T=150 µm in the SE electron source 101 according to the second embodiment. The inclination of the electron beam 115 is indicated by percentage as compared to inclination of the electron beam 115 when T=150 µm in the SE electron source 201 in the related art. The other conditions used for the calculation are the same as those in FIG. 10.

In lines of 90%, 50%, 0%, −50%, and −90% shown in FIG. 11A, the L is smaller and the θ is larger than those in FIG. 8A.

Under a condition of θ=90°, the L at which the inclination of the electron beam 115 is 90% of that in the related art is about 21.10 µm. Since the electric field generated by the tapered surface 306 becomes weak, it is necessary to make the L smaller than 2110 at the others θ µm in order to obtain the inclination of 90%. Therefore, in order to obtain the inclination of the electron beam of 90% or less, it is necessary to set the L to 2110 µm or less at any angle.

Similarly, under the condition of θ=90°, the L at which the inclination of the electron beam 115 is 50% of that in the related art is about 1450 µm. Therefore, in order to obtain the inclination of the electron beam of 50% or less, it is necessary to set the L to 1450 µm or less at any angle.

Similarly, under the condition of θ=90°, the L at which the inclination of the electron beam 115 is 0% is 1130 µm. Therefore, in order to obtain the inclination of the electron beam of 0%, it is necessary to set the L to 1130 µm or less at any angle.

FIG. 11B is a diagram in which a vertical axis of FIG. 11A is represented by log θ. A unit of the θ is degree (°), and a unit of the L is µm. The lines of 90%, 50%, 0%, −50%, and −90% are approximated by the following quadratic functions, respectively, when the vertical axis is represented by log θ.

The lines of 90%, 50%, 0%, −50%, and −90% are expressed in order as follows.

$$\log \theta = 2.69 \times 10^{-7} \times L^2 + 3.64 \times 10^{-4} \times L - 2.21 \times 10^{-2}$$

$$\log \theta = 4.62 \times 10^{-7} \times L^2 + 1.70 \times 10^{-4} \times L + 0.74$$

$$\log \theta = 6.92 \times 10^{-7} \times L^2 - 6.94 \times 10^{-6} \times L + 1.08$$

$$\log \theta = 9.88 \times 10^{-7} \times L^2 - 2.25 \times 10^{-4} \times L + 1.31$$

$$\log \theta = 1.27 \times 10^{-6} \times L^2 - 4.18 \times 10^{-4} \times L + 1.45$$

Therefore, in the SE electron source 101 using the suppressor electrode 305 according to the second embodiment, when the protrusion length T is 150 µm, performing design using the and the θ within the ranges defined by the above expressions is one indicator. For example, when the inclination of the electron beam is reduced from 90% to −90% of that in the related art, the design may be performed to satisfy a relationship of $2.69 \times 10^{-7} \times L^2 + 3.64 \times 10^{-4} \times L - 2.21 \times 10^{-2} \leq \log \theta \leq 1.27 \times 10^{-6} \times L^2 - 4.18 \times 10^{-4} \times L + 1.45$ by using the above expressions in cases of 90% and −90%.

Further, as will be described later, a range of the protrusion length T and a range of the allowable L has a proportional relationship. Therefore, appropriate ranges of the L and the θ when the T is between 150 µm and 250 µm are in an intermediate region between the ranges shown in FIGS. 8A, 8B, 11A, and 11B. In the second embodiment, when the T is less than 200 µm, the L and the θ within the ranges shown in FIGS. 11A and 11B are used as one threshold. Within the ranges, even if the T is less than 200 µm, the inclination of the electron beam can be reduced as compared to that in the related art.

Next, an appropriate relationship between the L and the θ when the protrusion length T is 350 µm in the SE electron source 101 according to the second embodiment will be described with reference to FIGS. 12A and 12B. FIG. 12A shows a result obtained by calculating the inclination of the electron beam obtained when the L and the θ are changed under a condition of T=350 µm in the SE electron source 101 using the suppressor electrode 305 according to the second embodiment. The inclination of the electron beam 115 is indicated by percentage as compared to the inclination of the electron beam 115 when T=350 µm in the SE electron source 201 in the related art. The other conditions used for the calculation are the same as those in FIG. 10.

In lines of 90%, 50%, 0%, −50%, and −90% shown in FIG. 12A, the L is larger and the θ is less than those in FIG. 8A.

Under the condition of θ=90°, the L at which the inclination of the electron beam 115 is 90% of that in the related art is about 2810 µm. Since the electric field generated by the tapered surface 306 becomes weak, it is necessary to make the L less than 2810 µm at the others θ in order to obtain the inclination of 90%. Therefore, in order to obtain the inclination of the electron beam of 90% or less, it is necessary to set the L to 2810 µm or less at any angle.

Similarly, under the condition of θ=90, the L at which the inclination of the electron beam 115 is 50% of that in the related art is about 2270 µm. Therefore, in order to obtain the inclination of the electron beam of 50% or less, it is necessary to set the L to 2270 µm or less at any angle.

Similarly, under the condition of θ=90°, the L at which the inclination of the electron beam 115 is 0% is 1990 µm. Therefore, in order to obtain the inclination of the electron beam of 0%, it is necessary to set the L to 1990 µm or less at any angle.

FIG. 12B is a diagram in which a vertical axis of FIG. 12A is represented by log θ. A unit of the θ is degree (°), and a unit of the L is µm. The lines of 90%, 50%, 0%, −50%, and −90% are approximated by the following quadratic functions, respectively, when the vertical axis is represented by log θ.

The lines of 90%, 50%, 0%, −50%, and −90% are expressed in order as follows.

$$\log \theta = 2.59 \times 10^{-7} \times L^2 + 1.82 \times 10^{-4} \times L - 6.04 \times 10^{-1}$$

$$\log \theta = 3.32 \times 10^{-7} \times L^2 + 5.07 \times 10^{-5} \times L + 1.26 \times 10^{-1}$$

$$\log \theta = 4.12 \times 10^{-7} \times L^2 - 8.01 \times 10^{-5} \times L + 4.75 \times 10^{-1}$$

$$\log \theta = 4.62 \times 10^{-7} \times L^2 - 1.49 \times 10^{-4} \times L + 6.76 \times 10^{-1}$$

$$\log \theta = 5.15 \times 10^{-7} \times L^2 - 2.29 \times 10^{-4} \times L + 8.10 \times 10^{-1}$$

Therefore, in the SE electron source 101 according to the second embodiment, when the protrusion length T is 350 μm, performing design using the L and the θ within the ranges defined by the above expressions is one indicator. For example, when the inclination of the electron beam is reduced from 90% to −90% of that in the related art, the design may be performed to satisfy a relationship of $2.59 \times 10^{-7} \times L^2 + 1.82 \times 10^{-4} \times L - 6.04 \times 10^{-1} \leq \log \theta \leq 5.15 \times 10^{-7} \times L^2 - 2.29 \times 10^{-4} \times L + 8.10 \times 10^{-1}$ by using the above expressions in cases of 90% and −90%.

Therefore, appropriate ranges of the L and the θ when the T is between 250 μm and 350 μm are in an intermediate region between the ranges shown in FIGS. 8A, 8B, 12A, and 12B. In the second embodiment, when the T is larger than 300 μm, the L and the θ within the ranges shown in FIGS. 12A and 12B are used as one threshold. Within the ranges, even if the T is larger than 300 μm, the inclination of the electron beam can be reduced as compared to that in the related art.

By performing the calculation as described above, in the SE electron source 101 using the suppressor electrode 305 according to the second embodiment, a maximum value of the L for allowing the amount of inclination of the electron beam 115 when the protrusion length T is changed is obtained as follows. FIG. 13 shows values of the L for setting the inclination of the electron beam to 90%, 50%, and 0% compared to the case in the related art under the condition of θ=90° when the protrusion length T is from 150 μm to 350 μm.

At the θ other than θ=90°, the electric field generated by the tapered surface 306 becomes weak, and it is necessary to further reduce the L. Therefore, the L shown in FIG. 13 is a maximum permissible L for obtaining the inclination of the electron beam 115 of each percentage. In any percentage line, the L and the T have a linear relationship, and the L increases in proportion to the T. Therefore, even if the protrusion length is out of the protrusion length calculated above, an appropriate range can be known.

At the protrusion length of 350 μm, in order to obtain the inclination of 90% or less of that in the related art, it is necessary to set the L to at least 2810 μm or less as shown in FIG. 12A. When the value of the L is equal to or less than 2810 μm, even if the protrusion length is less than 350 μm, the inclination of the electron beam can be set to 90% or less. In addition, since the T and the L shown in FIG. 13 can be approximated due to the substantially linear relationship, in other words, if the relationship between the L and the T satisfies L≤3.53T+1607 that is an approximate expression of a straight line in which the inclination of the electron beam is 90%, the inclination of the electron beam can be set to 90% or less. Here, the units of the L and the T are μm.

Similarly, at the protrusion length of 350 μm, in order to obtain the inclination of 50% or less of that in the related art, it is necessary to set the L to at least 2270 μm or less as shown in FIG. 12A. When the value of the L is equal to or less than 2270 μm, even if the protrusion length is less than 350 μm, the inclination of the electron beam can be set to 50% or less. In other words, if the relationship between the L and the T satisfies L≤4.10T+861 that is an approximate expression of a straight line in which the inclination of the electron beam is 50%, the inclination of the electron beam can be set to 50% or less.

Further, similarly, at the protrusion length of 350 μm, in order to obtain the inclination of 0% of that in the related art, it is necessary to set the L to at least 1990 μm or less as shown in FIG. 12A. When the value of the L is equal to or less than 1990 μm, even if the protrusion length is less than 350 μm, the inclination of the electron beam can be set to 0%. In other words, if the relationship between the L and the T satisfies L≤4.29T+522 that is an approximate expression of a straight line in which the inclination of the electron beam is 0%, the inclination of the electron beam can be set to 0%.

Summarizing the above results, it is found that in order to reduce the amount of inclination of the electron beam by at least 10%, that is, to reduce the amount to 90% or less, it is necessary to set the diameter L to 2810 μm or less when the protrusion length T=350 μm. It can be understood that when the value of the L is equal to or less than 2810 μm, even if the protrusion length is less than 350 μm, the inclination of the electron beam can be set to 90% or less. As described above, the protrusion length T of the tip 202 is typically about 150 to 350 μm in many cases. Therefore, one indicator can be obtained that the diameter of the plane 205 (the front end portion 213) can be set to 2810 μm or less.

Third Embodiment

In the second embodiment, under conditions in which the protrusion length T of the tip 202 is different, the tapered surface 306 is provided in the suppressor electrode 305 to prevent the electron beam from being bent at a time of axial shift. In a third embodiment, a stepped step is used as an example of another receding surface.

FIG. 14 shows a configuration of an SE electron source 501 according to the third embodiment. In the third embodiment, a stepped step 502 is provided on a lower surface of the suppressor electrode 305. That is, the stepped step 502 in which θ=90° is provided in a corner portion 503 in the vicinity of the central axis Z with a diameter of the front end portion 213 (plane 205) being L, and the receding portion 212 is formed by the corner portion 503, the step 502, and a plane portion 504. The stepped step 502 corresponds to a state in which the taper angle θ of the tapered portion 306 is set to θ=90° in the first embodiment and the second embodiment. As described above, an electric field generated by a receding surface of the receding portion 212, that is, the tapered portion 306 at a time of axial shift becomes stronger as the θ becomes larger. Therefore, compared to the tapered surface 306, there is an advantage that the L can be increased by using the stepped step 502. The suppressor electrode according to the third embodiment can also be considered to have a tapered shape having the surface (step) 502 with a taper angle of 90° and the plane 504 with a taper angle of 0°.

In addition, the electric field may be concentrated on the corner portion 503 of the stepped step 502 connected to the plane 205 due to an extraction voltage and discharge may occur. Therefore, the corner portion 503 may be chamfered or rounded.

Fourth Embodiment

In the third embodiment, as another example of a receding surface provided in the suppressor electrode 305, a configuration in which a stepped step is used is described. In a fourth embodiment, a wedge-shaped surface is used as another example of the receding surface.

FIG. 15 shows a configuration of an SE electron source 505 according to the fourth embodiment. In the fourth embodiment, a wedge-shaped surface 506 is provided on a lower surface of the suppressor electrode 305. The wedge-shaped surface 506 corresponds to a state in which the taper angle θ of the tapered portion 306 is set to θ>90° in the first embodiment and the second embodiment. Also in this configuration, the electron beam can be prevented from bending by generating an electric field in an opposite direction at a time of axial shift. In particular, when the electric field is concentrated on a vertex 507 of the wedge-shaped surface 506, a large amount of electrical charges are generated at the vertex 507, and the electron beam 115 can be effectively prevented from bending. However, on the other hand, an electric field larger than that of the corner portion 503 shown in the third embodiment is applied to the vertex 507, and a possibility of discharge is further increased. Therefore, it is preferable that θ≤90°.

Fifth Embodiment

In the fourth embodiment, the configuration in which a wedge-shaped surface is used as another example of the receding surface provided in the suppressor electrode 305 is described. In a fifth embodiment, a curved surface is used as another example of the receding surface provided in the suppressor electrode 305.

FIG. 16 shows a configuration of an SE electron source 510 according to the fifth embodiment. In the fifth embodiment, a curved surface 511 is provided on a lower surface of the suppressor electrode 305. That is, a structure has a curved portion 511 in a cross section (shaded portion in FIG. 16) passing through the central axis Z of the suppressor electrode 305. Hereinafter, the curved portion on the cross section is simply referred to as a curved portion or a curved surface. According to another expression, the curved surface 511 can be expressed as a curved surface portion in which an angle (taper angle) formed with a surface perpendicular to the central axis continuously changes. Even if the receding surface is the curved portion (curved surface), the receding surface is a surface that is farther away from a distal end of the tip 202 in a Z direction than the front end portion 213 (plane 205) of the suppressor electrode, and recedes. As a result, at a time of axial shift, the positive electrical charges 410 and the negative electrical charges 411 shown in FIG. 5D are generated on the curved surface 511, and an electron beam can be prevented from bending by the same principle. The diameter L of the plane 205 according to the fifth embodiment is a diameter at a position from which the curved portion (curved surface) 511 starts.

The curved portion (curved surface) 511 may be a sphere, an ellipse, or any aspherical surface. As described above, the curved portion (curved surface) 511 can be regarded as a surface formed by combining an infinite number of tapered portions having a minute change in continuous angle. Therefore, when a diameter at any position on the curved portion (curved surface) 511 is newly regarded as L' and an inclination angle at that position is newly regarded as θ', it is possible to obtain an effect of preventing the desired electron beam 115 from bending by including the L' and the θ' at at least one or more position in the ranges shown in FIGS. 8A and 8B, or any of FIGS. 11A and 11B and 12A and 12B. Since the curved portion (curved surface) 511 does not have a corner portion, there is an advantage that electric field concentration is alleviated and risk of discharge is reduced.

Sixth Embodiment

In the fifth embodiment, a configuration in which a curved portion (curved surface) on a cross section is used as another example of a receding surface provided in the suppressor electrode 305 is described. In a sixth embodiment, as another example of the receding surface provided in the suppressor electrode 305, a configuration in which a plurality of tapered surfaces or steps are combined is used.

FIG. 17 shows a configuration of an SE electron source 515 according to the sixth embodiment. In the sixth embodiment, a tapered surface 516, a tapered surface 517, and a stepped step 518 are provided on a lower surface of the suppressor electrode 305, and a plurality of portions having different taper angles are provided. Even when a plurality of tapered surfaces, steps, or curved surfaces are combined, the electron beam 115 can be prevented from bending by generating an electric field in an opposite direction formed by these surfaces at a time of axial shift. The electric field in the opposite direction is a sum of the electric fields generated by the tapered surface 516, the tapered surface 517, and the stepped step 518. Assuming that start positions of the respective surfaces are L1, L2, and L3 and angles of inclination are θ1, θ2, and θ3, it is possible to obtain an effect of preventing a desired electron beam from bending by including at least one or more of combinations of L1 and θ1, L2 and θ2, and L3 and θ3 in the ranges of the L and the θ shown in FIGS. 8A and 8B, or FIGS. 11A and 11B and 12A and 12B. The number of combinations of the tapered surfaces and the steps may be further increased, and the tapered surfaces and the steps may be replaced with curved surfaces or wedge-shaped surfaces.

Seventh Embodiment

In the sixth embodiment, as another example of the receding surface provided in the suppressor electrode 305, a configuration in which a plurality of tapered surfaces or steps are combined is described. In a seventh embodiment, as another example of a receding surface provided in the suppressor electrode 305, a configuration of a single tapered surface is used.

FIG. 18 shows a structure of an SE electron source 520 according to the seventh embodiment. In the seventh embodiment, the single tapered surface 306 is provided on a lower surface of the suppressor electrode 305. In a configuration of the seventh embodiment, there is no plane 205 shown in FIG. 4. Absence of the plane 205 corresponds to a state in which L=d=400 μm in the first embodiment and the second embodiment. Under this condition, by designing a relationship between the L and the θ and a relationship between the L and the T to satisfy the relationships described in the first embodiment and the second embodiment, it is possible to obtain the suppressor electrode 305 that effectively prevents the electron beam 115 from bending.

This configuration has an advantage that a manufacturing cost can be reduced because processing on the lower surface of the suppressor electrode 305 is simple. However, as described above, there is a risk that an electric field is concentrated on a distal end 521 of the tapered surface 306 and discharge occurs. As described above, it is difficult to adjust the protrusion length T of the tip 202 at a time of assembly. In addition, as shown in FIG. 9, a required suppressor voltage increases. Therefore, as long as other design matters allow, it is desirable to provide the plane 205 as in the first embodiment.

Although the embodiments according to the invention have been specifically described above, the invention is not limited to the above-described embodiments, and various modifications can be made without departing from the scope of the invention. For example, the calculation conditions of the calculation results shown in FIGS. 6A to 13 are merely examples, and the calculation conditions are not limited thereto. In addition, an effect of the invention is exhibited by the shape of the suppressor electrode 305 acting on the electron beam 115. Therefore, the electron source 101 and the tip 202 in the embodiments according to the invention are not limited to those of the SE electron source described in the embodiments, and may be electron sources, tips, or ion sources of different types such as a CFE electron source, a thermal electron source, or a photoexcited electron source. Even in these electron sources, tips, and ion sources, the same function and effect can be obtained by mounting the same suppressor electrode as in the embodiments according to the invention. A material of the tip 202 is not limited to tungsten, and may be another material such as $LaB_6$, $CeB_6$, or a carbon-based material. The electron source described in the embodiments according to the invention can also be used as an X-ray source that emits X-rays by irradiating a target of the X-ray source. In addition, the above-described embodiments have been described in detail as examples in order to explain the invention in an easy-to-understand manner, and the invention is not limited to those having the configurations described above. For example, although an example of the scanning electron microscope (SEM) is described as an example of the electron microscope, the invention is not limited thereto, and can be applied to various other electron microscopes such as a transmission electron microscope (TEM) and a scanning transmission electron microscope (STEM), and a charged particle beam device. A signal generated from the sample is not limited to electrons (secondary electrons, back scattered electrons, and the like), and may be a signal for detecting characteristic X-rays. The charged particle beam device can be applied not only to the electron microscope but also to an electron beam lithography device using an electron beam, an X-ray microscope, CT, an ion microscope, or the like. Furthermore, it is also possible to replace a part of the configuration of a certain embodiment with a configuration of another embodiment, or to add the configuration of another embodiment to the configuration of a certain embodiment. In addition, a part of the configurations of the embodiments may be added to, deleted from, or replaced with another configuration.

REFERENCE SIGNS LIST

101 SE electron source
102 extraction electrode
103 acceleration electrode
104 electron gun
109 turbo molecular pump
110 condenser lens
111 objective lens
112 sample
113 sample chamber
114 detector
115 electron beam
116 insulator
118 non-evaporable getter pump
120 ion pump
121 ion pump
122 ion pump
125 cylindrical body
126 first vacuum chamber
127 second vacuum chamber
128 third vacuum chamber
201 SE electron source in the related art
202 tip (single crystal wire which is an electron emission material)
203 suppressor electrode in the related art
204 opening
205 plane (bottom surface)
206 filament
207 terminal
208 insulator
209 chamfered portion
210 cylindrical surface
212 receding portion (surface)
213 front end portion
214 rear end portion
301 electric field
302 axis shift vector
305 suppressor electrode
306 tapered surface (portion)
307 corner portion
401 positive electrical charge
402 negative electrical charge
403 electrical flux line
404 positive electrical charge
405 negative electrical charge
406 spatial region
407 spatial region
408 electrical flux line
410 positive electrical charge
411 negative electrical charge
412 electrical flux line
413 spatial region
414 spatial region
420 positive electrical charge
421 negative electrical charge
422 negative electrical charge
423 negative electrical charge
424 positive electrical charge
501 SE electron source
502 step
503 corner portion
504 plane
505 SE electron source
506 wedge-shaped surface
507 vertex
510 SE electron source
511 curved surface
515 SE electron source
516 tapered surface
517 tapered surface
518 step
520 SE electron source
521 distal end

The invention claimed is:

1. An electron source comprising:
a suppressor electrode having an opening at one end portion thereof in a direction along a central axis; and
an electron emission material having a distal end protruding from the opening, wherein
the suppressor electrode further includes a receding portion receding to a position farther from the distal end of the electron emission material than the end portion of the suppressor electrode in the direction along the central axis at a position in an outer peripheral direction than the opening, and at least a part of the receding portion is disposed within a diameter of 2810 μm from a center of the opening.

2. The electron source according to claim 1, wherein the end portion of the suppressor electrode is a plane perpendicular to the central axis.

3. The electron source according to claim 2, wherein the plane has a diameter of 720 μm or more.

4. The electron source according to claim 1, wherein the receding portion includes a tapered portion having at least two or more different angles formed with a surface perpendicular to the central axis.

5. The electron source according to claim 1, wherein the receding portion includes a portion parallel to the central axis.

6. The electron source according to claim 1, wherein the receding portion includes a curved surface portion of which an angle formed with a surface perpendicular to the central axis continuously changes.

7. The electron source according to claim 1, wherein the receding portion includes a tapered portion forming an angle θ with a surface perpendicular to the central axis, at least a part of the tapered portion is disposed within a diameter L from the center of the opening, and the diameter L and the angle θ satisfy a relationship of $2.40\times10\ 7\times L2+3.18\ \times10\ 4\times L-4.08\times10\ 1 \leq \log \theta \leq 6.68\times 10\ 7\times L2-2.68\times10\ 4\times L+1.08$, the diameter being expressed in units of μm, and the angle θ being expressed in units of degrees (°).

8. The electron source according to claim 1, wherein at least a part of the receding portion is disposed within a diameter L from the center of the opening, the electron emission material protrudes from the opening by a length T, and the diameter L and the length T satisfy a relationship of $L=3.53T+1607$, both the diameter L and the length T being expressed in units of μm.

9. The electron source according to claim 1, wherein the receding portion includes a tapered portion forming an angle θ with a surface perpendicular to the central axis, at least a part of the tapered portion is disposed within a diameter L from the center of the opening, a length of the electron emission material protruding from the opening is smaller than 200 μm, and the diameter L and the angle θ satisfy a relationship of $2.69\times10\ 7\times L2+3.64\ \times10\ 4\times L-2.21\times10\ 2 \leq \log \theta \leq 1.27\times 10\ 6\times L2-4.18\times10\ 4\times L+1.45$, the diameter L being expressed in units of μm, and the angle θ being expressed in units of degrees (°).

10. The electron source according to claim 1, wherein the receding portion includes a tapered portion forming an angle θ with a surface perpendicular to the central axis, at least a part of the tapered portion is disposed within a diameter L from the center of the opening, a length of the electron emission material protruding from the opening is larger than 300 μm, and the diameter L and the angle θ satisfy a relationship of $2.59\times10\ 7\times L2+1.82\ \times10\ 4\times L-6.04\times10\ 1 \leq \log \theta < 5.15\times 10\ 7\times L2-2.29\times10\ 4\times L+8.10\times10\ 1$, the diameter L being expressed in units of μm, and the angle θ being expressed in units of degrees (°).

11. An electron gun comprising:
the electron source according to claim 1.

12. A charged particle beam device comprising:
the electron source according to claim 1 or the electron gun according to claim 11.

13. An electron source comprising:
a suppressor electrode having an opening at one end portion thereof in a direction along a central axis; and an electron emission material having a distal end protruding from the opening, wherein the suppressor electrode further includes a receding portion receding to a position farther from the distal end of the electron emission material than the end portion of the suppressor electrode in the direction along the central axis at a position in an outer peripheral direction than the opening, and the receding portion includes a tapered portion having at least two or more different angles formed with a surface perpendicular to the central axis.

14. An electron gun comprising:
the electron source according to claim 13.

15. A charged particle beam device comprising:
the electron source according to claim 13.

16. An electron source comprising:
a suppressor electrode having an opening at one end portion thereof in a direction along a central axis; and an electron emission material having a distal end protruding from the opening, wherein the suppressor electrode further includes a receding portion receding to a position farther from the distal end of the electron emission material than the end portion of the suppressor electrode in the direction along the central axis at a position in an outer peripheral direction than the opening, the receding portion includes a tapered portion forming an angle θ with a surface perpendicular to the central axis, at least a part of the tapered portion is disposed within a diameter L from a center of the opening, and the diameter L and the angle θ satisfy a relationship of $2.40\times10\ 7\times L2+3.18\ \times10\ 4\times L-4.08\times10\ 1 \leq \log \theta \leq 6.68\times 10\ 7\times L2-2.68\times10\ 4\times L+1.08$, the diameter L being expressed in units of μm, and the angle θ being expressed in units of degrees (°).

17. An electron source comprising:
a suppressor electrode having an opening at one end portion thereof in a direction along a central axis; and an electron emission material having a distal end protruding from the opening, wherein the suppressor electrode further includes a receding portion receding to a position farther from the distal end of the electron emission material than the end portion of the suppressor electrode in the direction along the central axis at a position in an outer peripheral direction than the opening, at least a part of the receding portion is disposed within a diameter L from a center of the opening, the electron emission material protrudes from the opening by a length T, and the diameter L and the length T satisfy a relationship of $L=3.53T+1607$, both the diameter L and the length T being expressed in units of μm.

* * * * *